US010798841B2

(12) United States Patent
Fujiki

(10) Patent No.: US 10,798,841 B2
(45) Date of Patent: Oct. 6, 2020

(54) ELECTRONIC APPARATUS AND METHOD FOR PRODUCING ELECTRONIC APPARATUS

(71) Applicant: KABUSHIKI KAISHA YASKAWA DENKI, Kitakyushu-shi (JP)

(72) Inventor: Takashi Fujiki, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 0 days.

(21) Appl. No.: 16/538,839

(22) Filed: Aug. 13, 2019

(65) Prior Publication Data

US 2020/0077532 A1    Mar. 5, 2020

(30) Foreign Application Priority Data

Aug. 30, 2018   (JP) ................... 2018-162179

(51) Int. Cl.
*H05K 7/14*    (2006.01)
*H02M 7/00*    (2006.01)
(Continued)

(52) U.S. Cl.
CPC ........... *H05K 7/1427* (2013.01); *G06F 1/186* (2013.01); *H01R 12/737* (2013.01);
(Continued)

(58) Field of Classification Search
CPC ..................................................... G06F 1/186
See application file for complete search history.

(56) References Cited

U.S. PATENT DOCUMENTS 4,979,075 A * 12/1990 Murphy ................. G06F 1/184
                                                29/830
5,442,520 A   8/1995 Kemp et al.
(Continued)

FOREIGN PATENT DOCUMENTS

JP       02-024585 U    2/1990
JP       02-089896 U    7/1990
(Continued)

OTHER PUBLICATIONS

Japanese Office Action for corresponding JP Application No. 2018-162179, dated Jul. 23, 2019 (w/ English machine translation).
(Continued)

*Primary Examiner* — Robert J Hoffberg
(74) *Attorney, Agent, or Firm* — Mori & Ward, LLP

(57) ABSTRACT

An electronic apparatus includes a housing, a first substrate, and at least one substrate module. The housing includes side plates and a bottom plate. The side plates define the inside space having a bottom opening. The side plates include a first side plate and a second side plate connected to the first side plate. The first side plate has a protrusion protruding toward the inside space of the housing. The bottom plate is connected to the side plates to close the bottom opening. The first substrate is provided in the inside space to face the bottom plate. The at least one substrate module is provided on the first substrate in the inside space. The substrate connecting member is provided on the first substrate to face the second side plate and has a hole into which the protrusion of the first side plate is inserted.

13 Claims, 17 Drawing Sheets

(51) Int. Cl.
*G06F 1/18* (2006.01)
*H05K 5/00* (2006.01)
*H05K 7/20* (2006.01)
*H05K 1/14* (2006.01)
*H05K 3/36* (2006.01)
*H01R 12/73* (2011.01)

(52) U.S. Cl.
CPC ............ *H02M 7/003* (2013.01); *H05K 1/141* (2013.01); *H05K 3/366* (2013.01); *H05K 5/0008* (2013.01); *H05K 5/0017* (2013.01); *H05K 7/209* (2013.01); *H05K 2201/044* (2013.01)

(56) References Cited

U.S. PATENT DOCUMENTS

| | | | |
|---|---|---|---|
| 5,757,618 A | | 5/1998 | Lee |
| 6,019,444 A | * | 2/2000 | Cosner .................... G06F 1/184 312/223.2 |
| 6,822,874 B1 | * | 11/2004 | Marler ................. H05K 7/1452 361/724 |
| 7,672,143 B2 | * | 3/2010 | Chou .................... G06F 1/186 361/747 |
| 8,363,412 B2 | * | 1/2013 | Budai .................... G06F 1/185 165/104.33 |
| 9,451,718 B2 | * | 9/2016 | Oneufer .................... H02B 1/36 |
| 2004/0012940 A1 | * | 1/2004 | Kim ..................... H05K 7/1454 361/801 |
| 2006/0018094 A1 | | 1/2006 | Robbins et al. |
| 2009/0225521 A1 | | 9/2009 | Jiang |
| 2014/0117825 A1 | | 5/2014 | Lee et al. |
| 2014/0247540 A1 | | 9/2014 | Steeves et al. |
| 2016/0309605 A1 | | 10/2016 | Cheng |

FOREIGN PATENT DOCUMENTS

| | | |
|---|---|---|
| JP | 04-290498 | 10/1992 |
| JP | 09-135090 | 5/1997 |

OTHER PUBLICATIONS

Extended European Search Report for corresponding EP Application No. 19186727.4, dated Jan. 27, 2020.
Chinese Office Action for corresponding CN Application No. 201910387688.6, dated Jul. 22, 2020.

* cited by examiner

ELECTRONIC APPARATUS AND METHOD FOR PRODUCING ELECTRONIC APPARATUS

CROSS-REFERENCE TO RELATED APPLICATIONS

The present application claims priority under 35 U.S.C. § 119 to Japanese Patent Application No. 2018-162179, filed Aug. 30, 2018. The contents of this application are incorporated herein by reference in their entirety.

BACKGROUND

Field of the Invention

The embodiments disclosed herein relate to an electronic apparatus and a method for producing an electronic apparatus.

Discussion of the Background

JP 9-135090 A discloses an electronic apparatus. The electronic apparatus includes an electronic circuit module and a guide plate. The electronic circuit module includes a print wiring board, a heat discharge plate, and an electronic circuit part. The guide plate is disposed on the inside of the chassis of the electronic apparatus, and has a guide groove through which the electronic circuit module is guided to be attached and detached to and from the guide plate.

SUMMARY

According to one aspect of the present disclosure, an electronic apparatus includes a housing, a first substrate, and at least one substrate module. The housing includes side plates and a bottom plate. The side plates surround an inside space of the housing to define the inside space having a bottom opening. The side plates include a first side plate and a second side plate connected to the first side plate. The first side plate has a protrusion protruding toward the inside space of the housing. The bottom plate is connected to the side plates to close the bottom opening. The first substrate is provided in the inside space to face the bottom plate. The at least one substrate module is provided on the first substrate in the inside space. The at least one substrate module includes a substrate connecting member and a second substrate. The substrate connecting member is provided on the first substrate to face the second side plate and has a hole into which the protrusion of the first side plate is inserted. The second substrate is connected to the substrate connecting member to face the substrate connecting member.

According to another aspect of the present disclosure, a method for producing an electronic apparatus includes placing a first substrate in a housing to face a bottom plate of the housing; placing at least one substrate module on the first substrate; inserting a protrusion of a side plate of the housing into a hole of a substrate fixing member of the at least one substrate module; and moving the at least one substrate module in a direction perpendicular to the bottom plate after inserting the protrusion into the hole.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
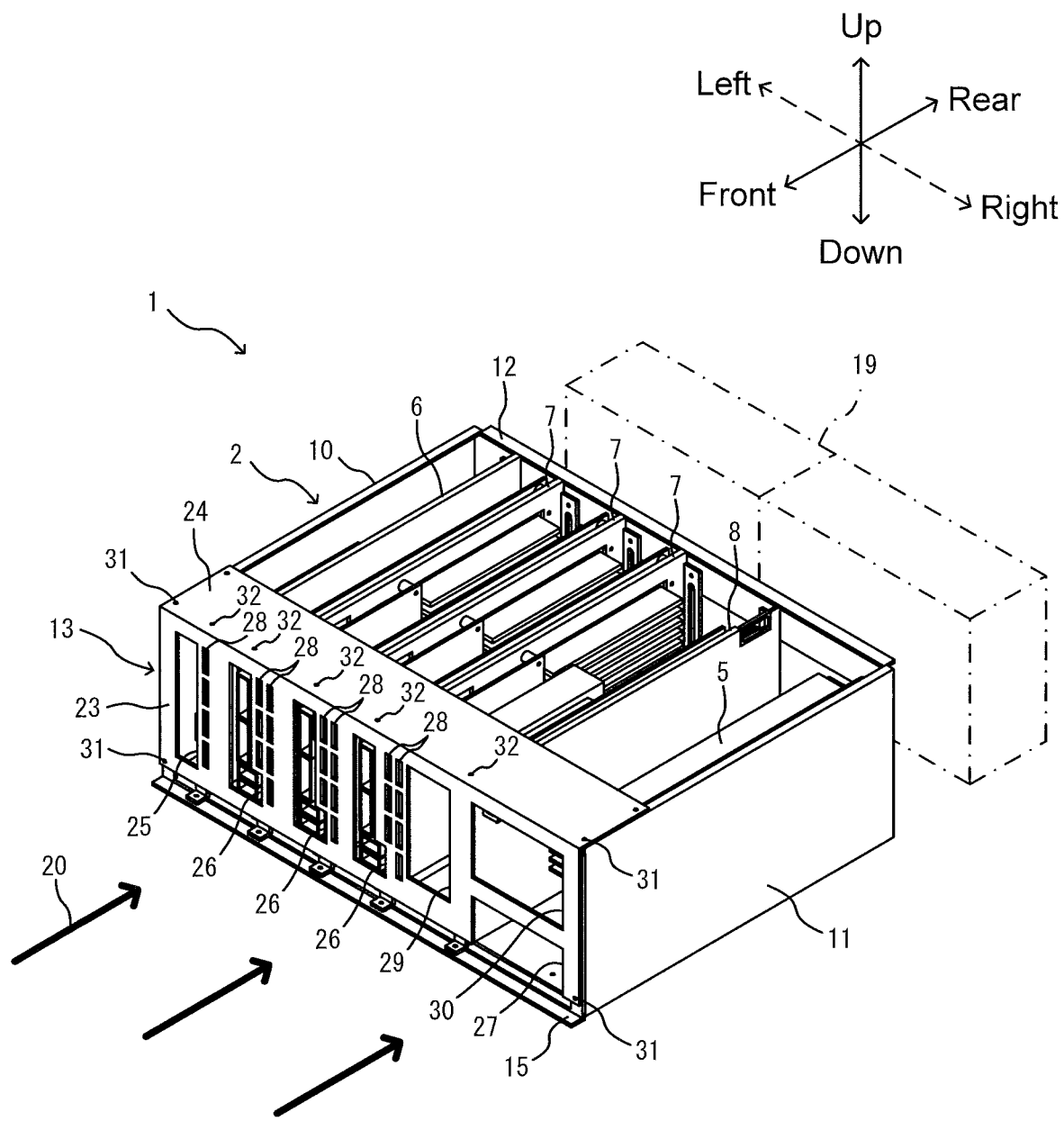
FIG. 1 is a perspective view of an example general configuration of a motor control apparatus according to an embodiment.

The embodiments will now be described with reference to the accompanying drawings, wherein like reference numerals designate corresponding or identical elements throughout the various drawings. While in the following embodiment a motor control apparatus that controls a motor will be described as an example electronic apparatus, an electronic apparatus will not be limited to a motor control apparatus. Also, for convenience of description of a configuration of the motor control apparatus, the following description uses "up", "down", "right", "left", "front", "rear", and other direction indicating term's. These direction indicating terms, however, are not intended as limiting the relative positions of the elements.

1. General Arrangement of Motor Control Apparatus

By referring to FIGS. 1 and 2, an example general arrangement of a motor control apparatus 1 according to this embodiment will be described. It is to be noted that in FIGS. 1 and 2, screws for connecting parts are not illustrated.

Figure 2:
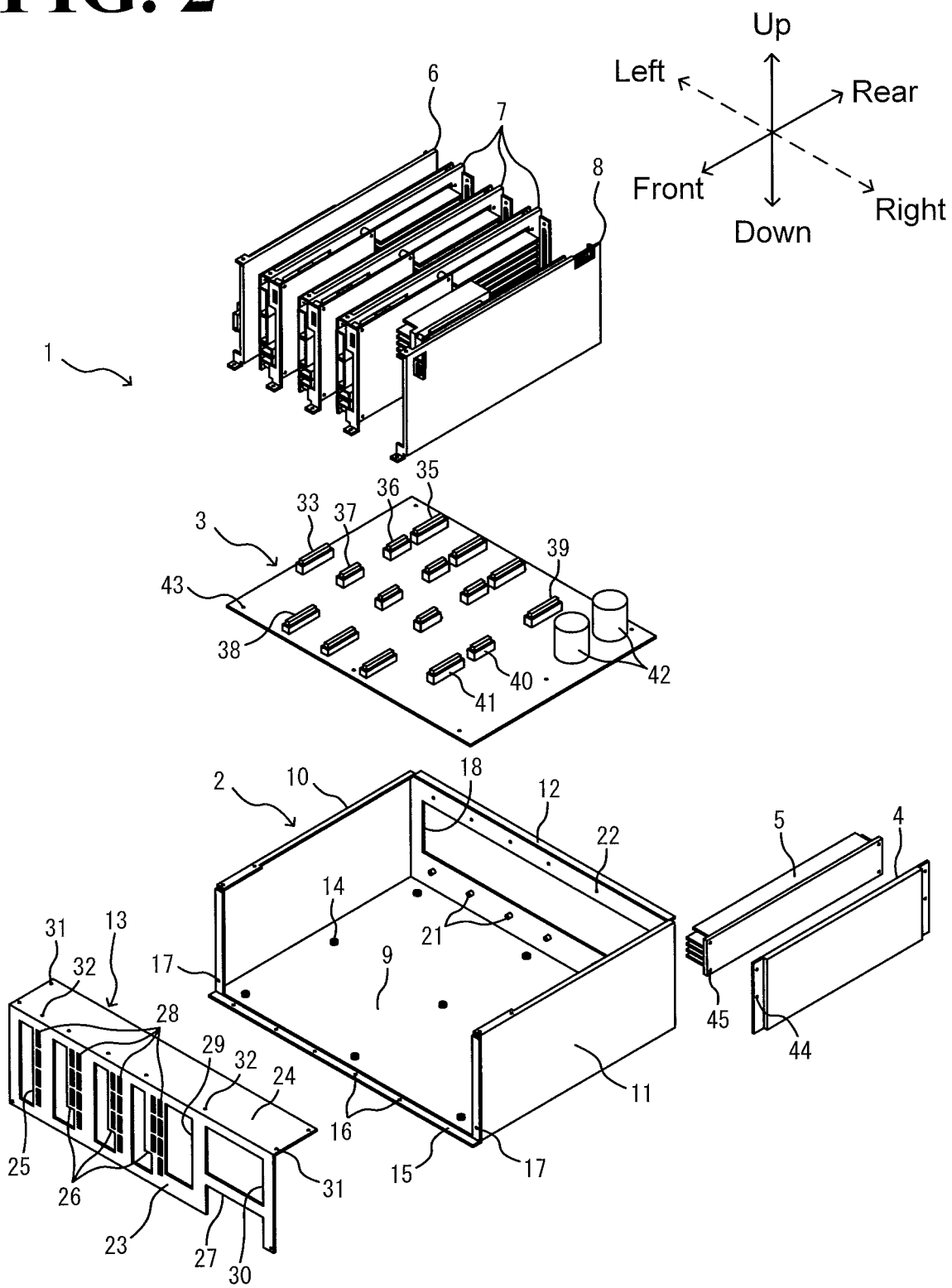
FIG. 2 is an exploded perspective view of an example general configuration of the motor control apparatus according to the embodiment.

As illustrated in FIGS. 1 and 2, the motor control apparatus 1 includes a housing 2, a main substrate 3, a regenerative resistor 4, a heat sink 5, an interface module 6, an inverter module 7, and a converter module 8. For ease of description, the interface module 6, the inverter module 7, and the converter module 8 will occasionally be referred to as substrate modules 6, 7, and 8 (or plurality of substrate modules 6, 7, and 8), where the modules need not be distinguished from each other.

The housing 2 is made of metal such as stainless, and includes a bottom plate 9 and a plurality of side plates 10, 11, 12, and 13 (four side plates 10, 11, 12, and 13 in the illustrated embodiment). The side plates 10, 11, 12, and 13 are perpendicular to the bottom plate 9. The side plate 10 stands upright on a left edge portion of the bottom plate 9. The side plate 11 stands upright on a right edge portion of the bottom plate 9. The side plate 12 stands upright on a rear edge portion of the bottom plate 9. The side plate 13 stands upright on a front edge portion of the bottom plate 9. The side plates 10 and 11 face each other in the rightward and leftward directions. The side plates 12 and 13 face each other in the frontward and rearward directions. The side plates 10, 11, and 12 are integral to the bottom plate 9, but may be separate from the bottom plate 9. The side plate 13 is separate from the bottom plate 9, that is, the side plate 13 is attachable and detachable to and from the side plates 10 and 11. For ease of description, the side plates 10, 11, 12, and 13 will occasionally be referred to as the left side plate 10, the right side plate 11, the rear side plate 12, and the front side plate 13, respectively.

On the bottom plate 9, a plurality of bosses 14 (nine bosses 14 in the illustrated embodiment) protrude toward the inside space of the housing 2 (that is, the bosses 14 protrude in the upward direction). The bosses 14 are threaded on the inside to receive respective screws 140 to fix the main substrate 3 (see FIG. 9, described later). The bottom plate 9 also includes an extension 15. The extension 15 is disposed at a lower edge portion of the front edge portion of the bottom plate 9, and protrudes in the frontward direction. Screw holes 16 are formed on the extension 15 at positions respectively corresponding to the plurality of substrate modules 6, 7, and 8 so that the screw holes 16 receive respective screws 143 to fix the substrate modules 6, 7, and 8 (see FIG. 11, described later).

Screw holes 17 are formed on the left side plate 10 and the right side plate 11. Specifically, the screw holes 17 are disposed at an upper edge portion and the front edge portion of each side plate so that the screw holes 17 receive respective screws 148 to fix the front side plate 13 (see FIG. 16, described later). It is to be noted that a plurality of bosses 46 (four bosses 46 in the illustrated embodiment) are formed on the inner surface of the right side plate 11 (see FIG. 10, described later). The bosses 46 protrude toward the inside space of the housing 2 (that is, in the leftward direction) to receive the regenerative resistor 4 and the heat sink 5.

The rear side plate 12 has an opening 18. The opening 18 has a length covering the plurality of substrate modules 6, 7, and 8 in the rightward and leftward directions. The opening 18 serves as a vent hole through which cooling air 20 flowing in the rearward direction from a cooling fan 19 (which is disposed outside the motor control apparatus 1, as illustrated in FIG. 1) passes. It is to be noted that the cooling fan 19 may be integral to the motor control apparatus 1. It is also to be noted that the cooling air 20 may flow in the frontward direction.

The rear side plate (a first side plate) 12 includes a plurality of protrusions 21 (five protrusions 21 in the illustrated embodiment) at positions respectively corresponding to the plurality of substrate modules 6, 7, and 8. The protrusions 21 protrude toward the inside space of the housing 2 (that is, in the frontward direction). The protrusions 21 are respectively engaged with the holes of the substrate modules 6, 7, and 8 (which will be detailed later). The rear side plate 12 also has through holes 22 at positions respectively corresponding to the plurality of substrate modules 6, 7, and 8. The through holes 22 receive respective screws 142 to fix the substrate modules 6, 7, and 8 (see FIG. 11, described later).

The front side plate 13 includes a front side panel 23 and an upper side panel 24. The front side panel 23 and the upper side panel 24 are formed by bending a single panel at right angles, but may be panels separate from each other. The front side panel 23 has a plurality of openings 25, 26, and 27 and a plurality of openings 28, 29, and 30. Through the plurality of openings 25, 26, and 27, connectors of the main substrate 3 and the substrate modules 6, 7, and 8 are exposed in the frontward direction. The plurality of openings 28, 29, and 30 serve as vent holes for the cooling air 20. On the front side panel 23 and the upper side panel 24, a plurality of through holes 31 are formed. The plurality of through holes 31 receive screws to fix the left side plate 10 and the right side plate 11. The upper side panel 24 also has a plurality of through holes 32 at positions respectively corresponding to the plurality of substrate modules 6, 7, and 8. The plurality of through holes 32 receive respective screws 149 to fix the substrate modules 6, 7, and 8 (see FIG. 16, described later).

The main substrate 3 (which is a non-limiting example of the first substrate recited in the appended claims) is a "mother board", and installed in parallel with the bottom plate 9 of the housing 2. The main substrate 3 includes a connector 33, a plurality of connectors 35, 36, 37, and 38 (four connectors 35, 36, 37, and 38 in the illustrated embodiment), and a plurality of connectors 39, 40, and 41 (three connectors 39, 40, and 41 in the illustrated embodiment). The connector 33 (which is a non-limiting example of the first connector recited in the appended claims) is connected with the interface module 6. The connectors 35, 36, 37, and 38 (which are non-limiting examples of the first connector recited in the appended claims) are connected with the inverter module 7. The connectors 39, 40, and 41 (which are non-limiting examples of the first connector recited in the appended claims) are connected with the converter module 8. The main substrate 3 also includes a plurality of electronic components 42, in addition to the above-described connectors. Also, the main substrate 3 has through holes 43 at positions respectively corresponding to the bosses 14 of the bottom plate 9.

The regenerative resistor 4 has a plurality of through holes 44 (four through holes 44 in the illustrated embodiment). The through holes 44 receive respective screws 141 to fix the regenerative resistor 4 to the inner surface of the right side plate 11 of the housing 2 (see FIG. 10, described later). The heat sink 5 has a plurality of through holes 45 (four through holes 45 in the illustrated embodiment). The plurality of through holes 45 receive the screws 141 to fix the heat sink 5 to the regenerative resistor 4 (see FIG. 10, described later). The front side panel 23 has an opening 30. The opening 30 is disposed at a position corresponding to the heat sink 5 so that the amount of the cooling air 20 supplied to the heat sink 5 is increased, thereby increasing the efficiency with which the regenerative resistor 4 is cooled.

The interface module 6 (which is a non-limiting example of the substrate module recited in the appended claims), a plurality of (three, in the illustrated embodiment) inverter modules 7 (which are non-limiting examples of the substrate module recited in the appended claims), and the converter module 8 (which is a non-limiting example of the substrate module recited in the appended claims) stand upright on the main substrate 3. The converter module 8, the three inverter modules 7, and the interface module 6 are arranged in this order from the side closest to the regenerative resistor 4 such that the substrate modules 6, 7, and 8 are parallel with each other. The substrate modules 6, 7, and 8 will be detailed later. It is to be noted that the number of the inverter modules 7 may be other than three (for example, one or two).

It is to be noted that the above-described configuration of the motor control apparatus 1 has been provided for example purposes only and is not intended in a limiting sense. Another possible example is that the housing 2 has a top plate to cover the top of the housing 2. Still another possible example is that the side plates 10 and 11 have openings to further reduce the weight of the housing 2 and further improve the heat dissipation performance of the housing 2. Still another possible example is that no cooling fan 19 is provided, so that heat is dissipated by natural convection alone. In this case, it is not necessary to provide vent openings on the rear side plate 12 and the front side plate 13.

2. Configuration of Interface Module

By referring to FIGS. 3 and 4, an example configuration of the interface module 6 will be described. The interface module 6 is a substrate module that electrically connects the motor control apparatus 1 to external devices.

Figure 3:
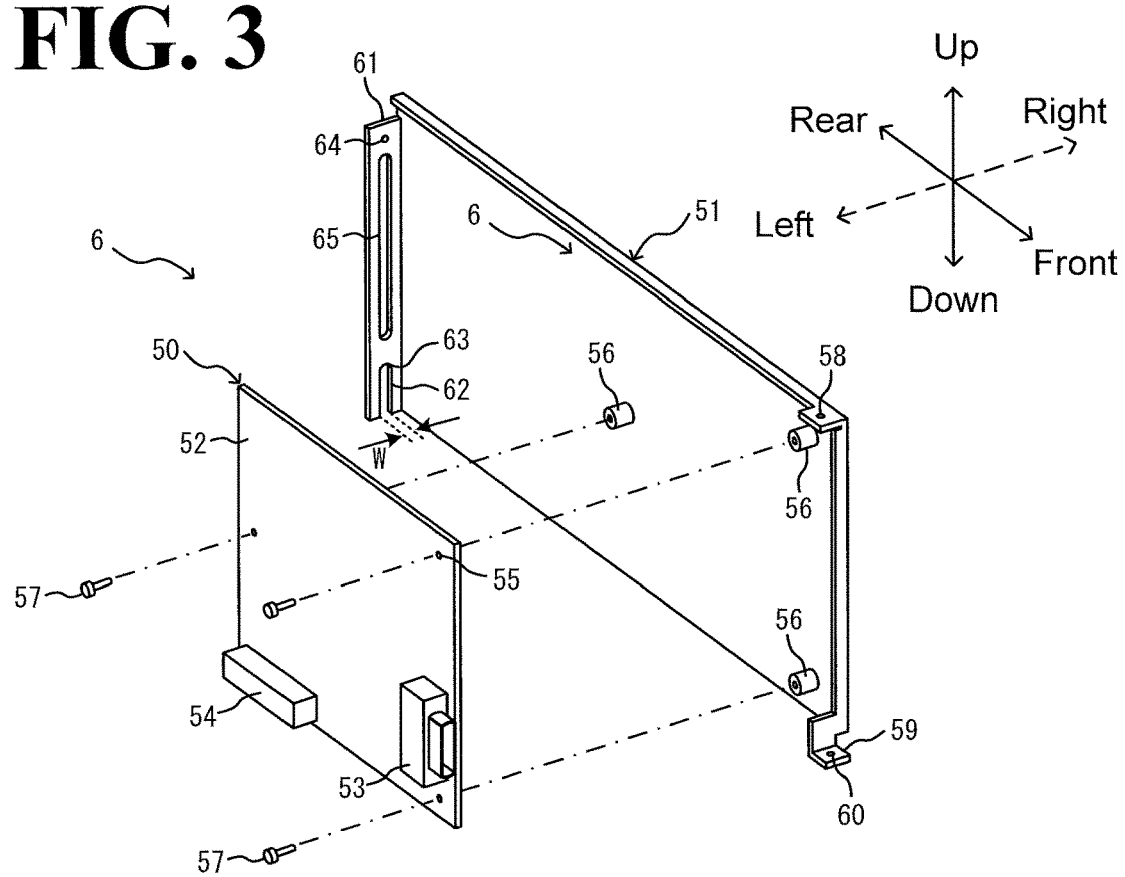
FIG. 3 is an exploded perspective view of an example configuration of an interface module.
Figure 4:
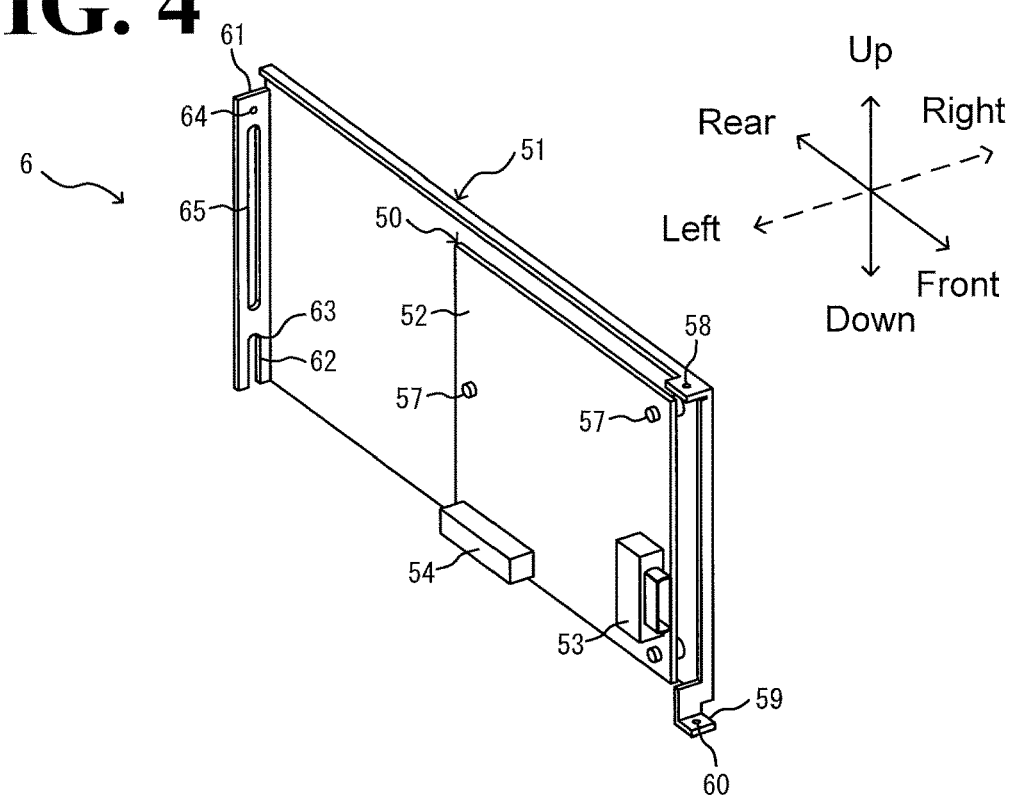
FIG. 4 is a perspective view of an example configuration of the interface module.

As illustrated in FIGS. 3 and 4, the interface module 6 includes an interface substrate 50 (which is a non-limiting example of the second substrate recited in the appended claims) and an interface plate 51 (which is a non-limiting example of the substrate connecting member recited in the appended claims). The surface of the interface substrate 50 opposite to the interface plate 51 (that is, the left surface of the interface substrate 50) is a component surface 52. At a front edge portion of the component surface 52, a connector 53 is disposed. The connector 53 is connected to external devices. At a lower edge portion of the component surface 52, a connector 54 (which is a non-limiting example of the second connector recited in the appended claims) is disposed. The connector 54 is connected to the connector 33 of the main substrate 3. It is to be noted that other electronic components of the interface substrate 50 than the connectors 53 and 54 are not illustrated. The interface substrate 50 also has through holes 55 near edge portions of the interface substrate 50. Specifically, the through holes 55 are disposed at positions respectively corresponding to a plurality of bosses 56 of the interface plate 51.

The interface plate 51 is made of metal such as stainless. The plurality of bosses 56 of the interface plate 51 (three bosses 56 in the illustrated embodiment) are disposed in a front half area of the surface of the interface plate 51 facing the interface substrate 50. The bosses 56 protrude toward the interface substrate 50 (that is, in the leftward direction). The bosses 56 are threaded on the inside to receive respective screws 57 to fix the interface substrate 50.

The interface plate 51 also has a screw hole 58 at a front end portion of an upper edge portion of the interface plate 51. Specifically, the screw hole 58 is disposed at a position corresponding to a corresponding one of the through holes 32 of the upper side panel 24 of the front side plate 13. The screw hole 58 receives a corresponding one of the screws 149 to fix the interface plate 51 to the upper side panel 24 (see FIG. 16). The interface plate 51 also includes a leg 59 at a lower end portion of a front edge portion of the interface plate 51. The leg 59 protrudes in the frontward direction. The leg 59 has a through hole 60 at a position corresponding to a corresponding one of the screw holes 16 of the extension 15 of the bottom plate 9. The leg 59 receives a corresponding one of the screws 143 to fix the interface plate 51 to the bottom plate 9 (see FIG. 11).

The interface plate 51 also includes an engagement plate 61 at a rear edge portion of the interface plate 51. The engagement plate 61 protrudes toward the interface substrate 50 (that is, in the leftward direction) and faces the rear side plate 12 of the housing 2. The engagement plate 61 is Mimed by bending the interface plate 51 at right angles, but may be a plate separate from the interface plate 51. The engagement plate 61 has a hole 62 at a lower end portion of the engagement plate 61. The hole 62 is engaged with a corresponding one of the protrusions 21, which are formed on the rear side plate 12. The hole 62 has a width W. Within the width W, movement of the protrusion 21 in the directions perpendicular to the interface substrate 50 (in the rightward and leftward directions) is restricted. That is, the width W of the hole 62 in the rightward and leftward directions is approximately the same as the diameter of the cylindrical protrusion 21. It is to be noted, however, that there is a small gap left between the hole 62 and the protrusion 21 so that the protrusion 21 is smoothly slidable in the hole 62. Also, the hole 62 has a longitudinal length in the directions perpendicular to the main substrate 3 (that is, in the upward and downward directions). The longitudinal length is greater than the width W, and the hole 62 is open on its lower end portion. Also, the hole 62 has an arcuate shape at an upper end portion of the hole 62, and the arcuate shape coincides with the side surface of the protrusion 21. With this configuration, the arcuate shape constitutes an abutting portion 63, which abuts on the side surface of the protrusion 21 with the connector 33 of the main substrate 3 completely connected to the connector 54 of the interface substrate 50.

A screw hole 64 is formed near an upper end portion of the engagement plate 61. Specifically, the screw hole 64 is disposed at a position corresponding to a corresponding one of the through holes 22 of the rear side plate 12. The screw hole 64 receives a corresponding one of the screws 142 to fix the interface plate 51 to the rear side plate 12 (see FIG. 11). The engagement plate 61 also has a longitudinal opening 65 at an intermediate portion between the hole 62 and the screw hole 64. The intermediate portion corresponds to the opening 18 of the rear side plate 12 so that the opening 65 serves as a vent hole for the cooling air 20.

It is to be noted that the above-described configuration of the interface module 6 has been provided for example purposes only and is not intended in a limiting sense.

3. Configuration of Inverter Module

By referring to FIGS. 5 and 6, an example configuration of the inverter module 7 will be described. The inverter module 7 is a substrate module that receives DC power converted from first AC power by the converter module 8, converts the DC power into second AC power, and supplies the second AC power to a motor.

Figure 5:
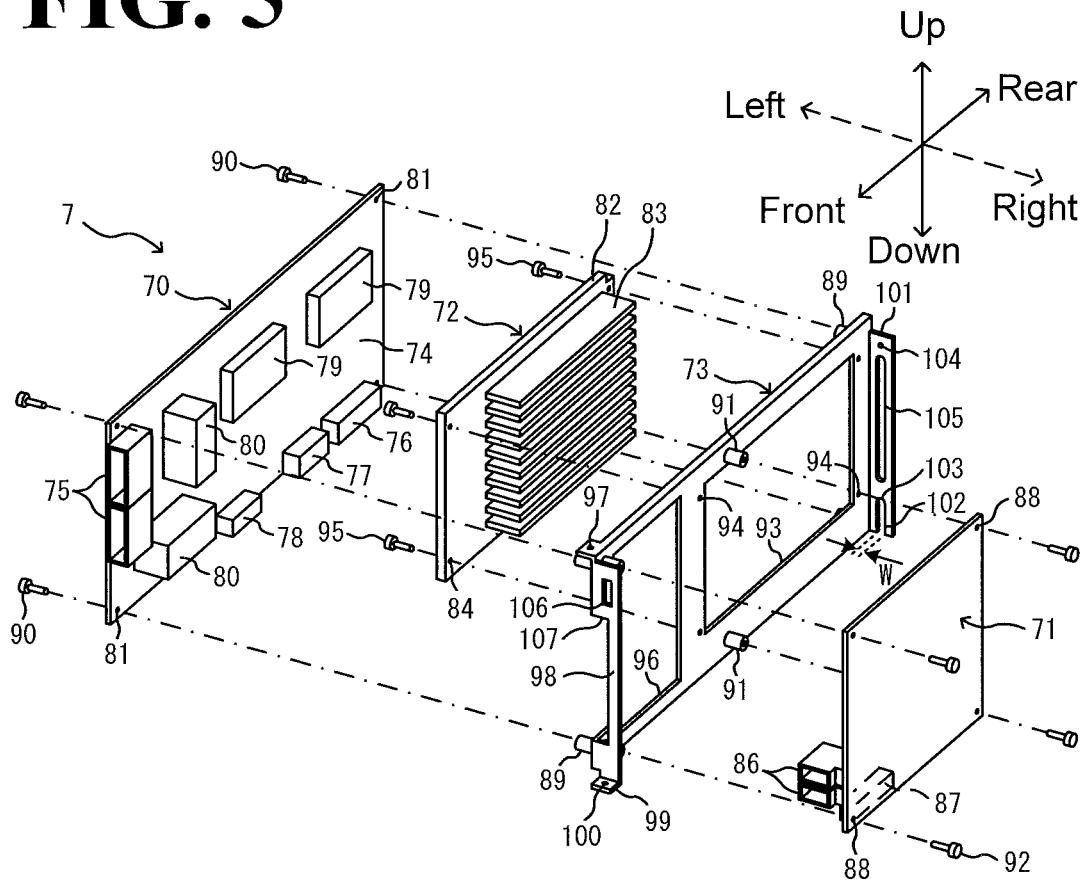
FIG. 5 is an exploded perspective view of an example configuration of an inverter module.
Figure 6:
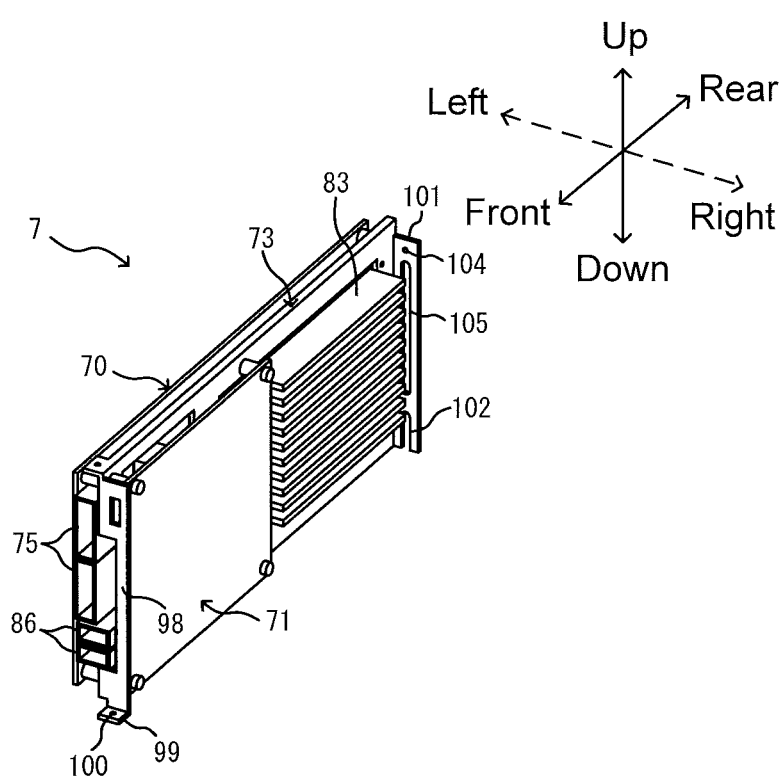
FIG. 6 is a perspective view of an example configuration of the inverter module.

As illustrated in FIGS. 5 and 6, the inverter module 7 includes an inverter power substrate 70 (which is a non-limiting example of the second substrate recited in the appended claims), an inverter control substrate 71 (which is a non-limiting example of the second substrate recited in the appended claims), a heat sink 72, and an inverter plate 73 (which is a non-limiting example of the substrate connecting member recited in the appended claims). The inverter power substrate 70 converts the DC power into the second AC power and supplies the second AC power to the motor. The inverter control substrate 71 controls power conversion performed by the inverter power substrate 70. The inverter power substrate 70 is disposed on one surface of the inverter plate 73, and the inverter control substrate 71 is disposed on the opposite surface of the inverter plate 73.

The surface of the inverter power substrate 70 facing the inverter plate 73 (that is, the right surface of the inverter power substrate 70) is a component surface 74. At a front edge portion of the component surface 74, a connector 75 is disposed. The connector 75 is connected to external devices. At a lower edge portion of the component surface 74, connectors 76, 77, and 78 (which are non-limiting examples of the second connector recited in the appended claims) are disposed. The connectors 76, 77, and 78 are respectively connected to the connectors 35, 36, and 37 of the main substrate 3. In a rear half area of the component surface 74, two power modules 79 (which are non-limiting examples of the electronic component recited in the appended claims) are disposed. The power modules 79 include switching elements. In a front half area of the component surface 74, two electronic components 80 are disposed. The electronic components 80 are greater in height than other electronic components. It is to be noted that other electronic components of the inverter power substrate 70 than the connector 75, the connectors 76, 77, and 78, the power modules 79, and the electronic components 80 are not illustrated. The inverter power substrate 70 also has through holes 81 near four corners of the inverter power substrate 70. Specifically, the inverter power substrate 70 is disposed at positions respectively corresponding to the bosses 89 of the inverter plate 73.

The heat sink 72 includes a base 82 and a plurality of fins 83. With this configuration, the heat sink 72 cools the two power modules 79, which are heat dissipating components disposed on the inverter power substrate 70. The surface of the base 82 facing the inverter power substrate 70 (that is, the left side surface of the base 82) contacts the power modules 79 via a heat conduction accelerating material such as thermal grease. The base 82 also has through holes 84 near four corners of the base 82. Specifically, the through holes 84 are disposed at positions respectively corresponding to screw holes 94 of the inverter plate 73.

The surface of the inverter control substrate 71 facing the inverter plate 73 (that is, the left side surface of the inverter control substrate 71) is a component surface 85. At a lower end portion of a front edge portion of the component surface 85, a connector 86 is disposed. The connector 86 is connected to external devices. At a lower edge portion of the component surface 85, a connector 87 (which is a non-limiting example of the second connector recited in the appended claims) is disposed. The connector 87 is connected to a connector 38 of the main substrate 3. It is to be noted that other electronic components of the inverter control substrate 71 than the connector 86 and the connector 87 are not illustrated. The inverter control substrate 71 also has through holes 88 near four corners of the inverter control substrate 71. Specifically, the through holes 88 are disposed at positions respectively corresponding to bosses 91 of the inverter plate 73.

The inverter plate 73 is made of metal such as stainless. The inverter plate 73 includes a plurality of bosses 89 (four bosses 89 in the illustrated embodiment) near four corners of the surface of the inverter plate 73 facing the inverter power substrate 70. The bosses 89 protrude toward the inverter power substrate 70 (that is, in the leftward direction). The bosses 89 are threaded on the inside to receive respective screws 90 to fix the inverter power substrate 70. The inverter plate 73 also includes a plurality of bosses 91 (four bosses 91 in the illustrated embodiment) in a front half area of the surface of the inverter plate 73 facing the inverter control substrate 71. The bosses 91 protrude toward the inverter control substrate 71 (that is, in the rightward direction). The bosses 91 are threaded on the inside to receive respective screws 92 to fix the inverter control substrate 71.

The inverter plate 73 also has an opening 93 in a rear half area of the inverter plate 73. The opening 93 is for the fins 83 of the heat sink 72 to pass through. Around the opening 93, a plurality of screw holes 94 (four screw holes 94 in the illustrated embodiment) are formed. The screw holes 94 receive respective screws 95 to fix the heat sink 72. As illustrated in FIG. 6, the fins 83 of the heat sink 72 protrude beyond the inverter plate 73 toward the side on which the inverter control substrate 71 is disposed (that is, in the rightward direction) without interference with the inverter control substrate 71 (that is, the fins 83 abut on a rear edge portion of the inverter control substrate 71). The openings 28 of the front side panel 23 are disposed at positions respectively corresponding to the fins 83 of the heat sink 72. This increases the amount of the cooling air 20 flowing in the fins 83, ensuring that the power modules 79 are cooled efficiently.

The inverter plate 73 also has an opening 96 in a front half area of the inverter plate 73. The opening 96 is for components including the greater height electronic components 80 to pass through. The configuration in which components including the electronic components 80 pass through the opening 96 reduces the thickness of the inverter module 7 in the rightward and leftward directions.

The inverter plate 73 also has a crew hole 97 at a front end portion of an upper edge portion of the inverter plate 73. Specifically, the crew hole 97 is disposed at a position corresponding to a corresponding one of the through holes 32 of the upper side panel 24 of the front side plate 13. The crew hole 97 receives a corresponding one of the screws 149 to fix the inverter plate 73 to the upper side panel 24 (see FIG. 16).

The inverter plate 73 also includes a fixing plate 98 at a front edge portion of the inverter plate 73. The fixing plate 98 protrudes toward the inverter control substrate 71 (that is, in the rightward direction) and faces the front side panel 23 of the front side plate 13. The fixing plate 98 is formed by bending the inverter plate 73 at right angles, but may be separate from the inverter plate 73. The fixing plate 98 has a leg 99 at a lower end portion of the fixing plate 98. The leg 99 protrudes in the frontward direction. The leg 99 has a through hole 100 at a position corresponding to a corresponding one of the screw holes 16 of the extension 15 of the bottom plate 9. The through hole 100 receives a corresponding one of the screws 143 to fix the inverter plate 73 to the bottom plate 9. The fixing plate 98 also has openings 106 and 107. The opening 106 serves as a vent hole for the cooling air 20. The opening 107 is connected to the opening 96, serving as a vent hole for the cooling air 20. Also, through the opening 107, the connector 86 of the inverter control substrate 71 is exposed in the frontward direction.

The inverter plate 73 also includes an engagement plate 101 at a rear edge portion of the inverter plate 73. The engagement plate 101 protrudes toward the inverter control substrate 71 (that is, in the rightward direction) and faces the rear side plate 12 of the housing 2. The engagement plate 101 is formed by bending the inverter plate 73 at right angles, but may be separate from the inverter plate 73. The engagement plate 101 has a hole 102 at a lower end portion of the engagement plate 101. The hole 102 is engaged with a corresponding one of the protrusions 21, which are formed on the rear side plate 12. The hole 102 has a width W. Within the width W, movement of the protrusion 21 in the directions perpendicular to the inverter power substrate 70 and the inverter control substrate 71 (that is, in the rightward and leftward directions) is restricted. That is, the width W of the hole 102 in the rightward and leftward directions is approximately the same as the diameter of the cylindrical protrusion 21. It is to be noted, however, that there is a small gap left between the hole 102 and the protrusion 21 so that the protrusion 21 is smoothly slidable in the hole 102. Also, the hole 102 has a longitudinal length in the directions perpendicular to the main substrate 3 (that is, in the upward and downward directions). The longitudinal length is greater than the width W, and the hole 102 is open on its lower end portion. Also, the hole 102 has an arcuate shape at an upper end portion of the hole 102, and the arcuate shape coincides with the side surface of the protrusion 21. With this configuration, the arcuate shape constitutes an abutting portion 103, which abuts on the side surface of the protrusion 21 with the connectors 35, 36, and 37 of the main substrate 3 respectively connected to the connectors 76, 77, and 78 of the inverter power substrate 70 completely and with the connector 38 of the main substrate 3 completely connected to the connector 87 of the inverter control substrate 71.

A screw hole 104 is formed near an upper end portion of the engagement plate 101. Specifically, the screw hole 104 is disposed at a position corresponding to a corresponding one of the through holes 22 of the rear side plate 12. The screw hole 104 receives a corresponding one of the screws 142 to fix the inverter plate 73 to the rear side plate 12. The engagement plate 101 also has a longitudinal opening 105 at an intermediate portion between the hole 102 and the screw hole 104. The intermediate portion corresponds to the opening 18 of the rear side plate 12 so that the opening 105 serves as a vent hole for the cooling air 20.

It is to be noted that the above-described configuration of the inverter module 7 has been provided for example purposes only and is not intended in a limiting sense.

4. Configuration of Converter Module

By referring to FIGS. 7 and 8, an example configuration of the converter module 8 will be described. The converter module 8 is a substrate module that converts AC power supplied from an AC power source into DC power.

Figure 7:
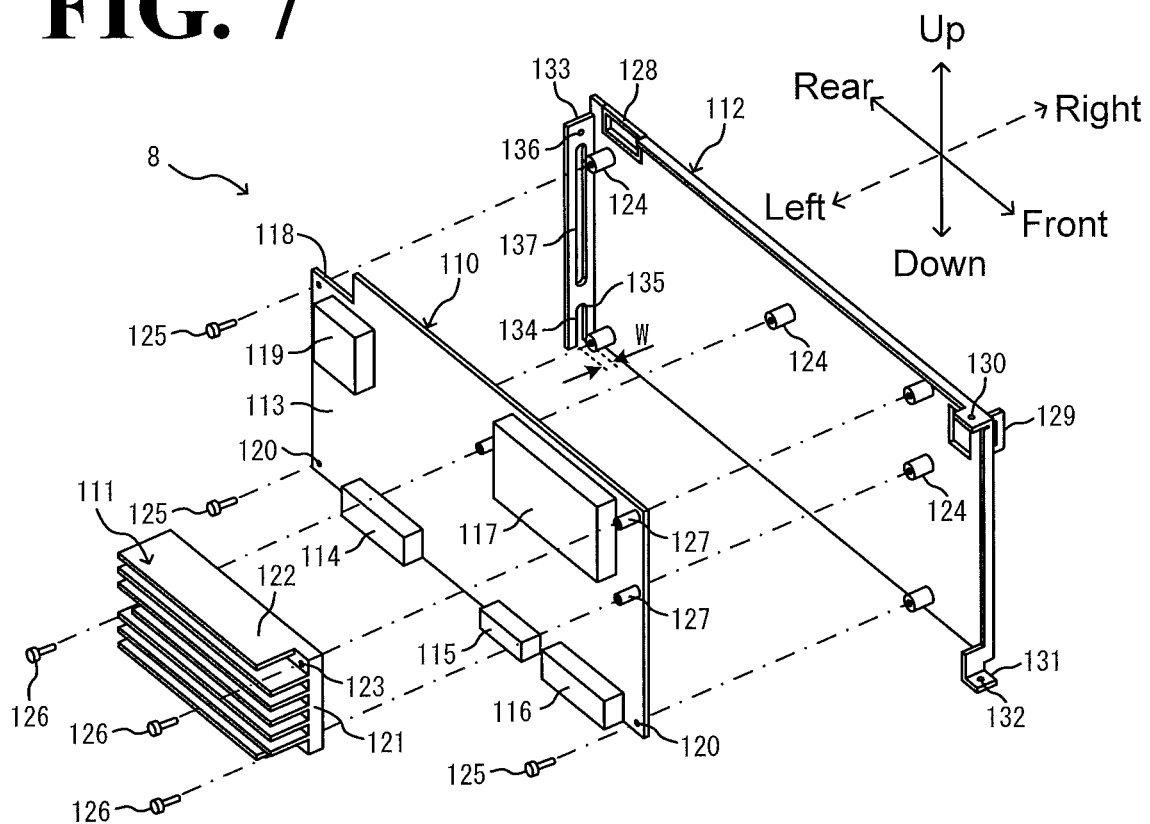
FIG. 7 is an exploded perspective view of an example configuration of a converter module.
Figure 8:
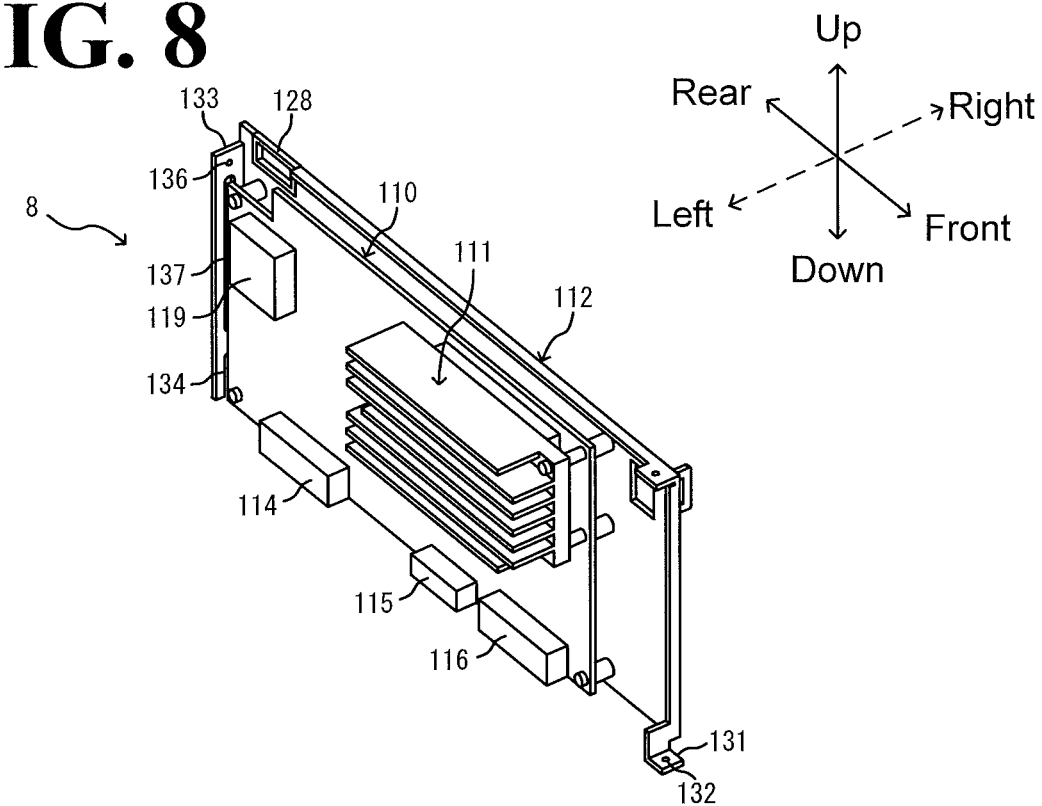
FIG. 8 is a perspective view of an example configuration of the converter module.

As illustrated in FIGS. 7 and 8, the converter module 8 includes a converter substrate 110 (which is a non-limiting example of the second substrate recited in the appended claims), a heat sink 111, and a converter plate 112 (which is a non-limiting example of the substrate connecting member recited in the appended claims).

The surface of the converter substrate 110 facing the heat sink 111 (that is, the left side surface of the converter substrate 110) is a component surface 113. At a lower edge portion of the converter substrate 110, connectors 114, 115, and 116 (which are non-limiting examples of the second connector recited in the appended claims) are disposed. The connectors 114, 115, and 116 are respectively connected to the connectors 39, 40, and 41 of the main substrate 3. Also, at an upper front portion of the component surface 113, a heat dissipating component 117 (which is a non-limiting example of the electronic component recited in the appended claims) is disposed. The heat dissipating component 117 generates heat when current is on. Also, an electronic component 119 is disposed in a rear half area of the component surface 113. Specifically, the electronic component 119 is disposed near a cut-away portion 118 of the converter substrate 110. It is to be noted that other electronic components of the converter substrate 110 than the connectors 114, 115, and 116, the heat dissipating component 117, and the electronic component 119 are not illustrated. The converter substrate 110 also has through holes 120 near edge portions of the converter substrate 110. Specifically, the through holes 120 are disposed at positions respectively corresponding to bosses 124 of the converter plate 112.

The heat sink 111 includes a base 121 and a plurality of fins 122. With this configuration, the heat sink 111 cools the heat dissipating component 117 (which is a non-limiting example of the electronic component recited in the appended claims), which is disposed on the converter substrate 110. The surface of the base 121 facing the converter substrate 110 (that is, the right side surface of the base 121) contacts the heat dissipating component 117 via a heat conduction accelerating material such as thermal grease. The base 121 has through holes 123 near edge portions of the base 121. Specifically, the through holes 123 are disposed at positions respectively corresponding to some of the bosses 124 of the converter plate 112 (three bosses 124 in the illustrated embodiment). The opening 29 of the front side panel 23 is disposed at a position corresponding to the heat sink 111. This increases the amount of the cooling air 20 flowing in the heat sink 111, ensuring that the heat dissipating component 117 is cooled efficiently.

The converter plate 112 is made of metal such as stainless. The plurality of bosses 124 (six bosses in the illustrated embodiment) are disposed on the surface of the converter plate 112 facing the converter substrate 110. The bosses 124 protrude toward the converter substrate 110 (that is, in the leftward direction). The bosses 124 are threaded on the inside to receive respective screws 125 to fix the converter substrate 110. It is to be noted that the three bosses 124 corresponding to the heat sink 111 receive respective screws 126 through the heat sink 111, sleeves 127, and the converter substrate 110, tightening the heat sink 111 and the converter substrate 110 together.

The converter plate 112 includes a clamp 128 at a rear end portion of an upper edge portion of the converter plate 112. Specifically, the clamp 128 is disposed at a position corresponding to the cut-away portion 118 of the converter substrate 110. One cable or a plurality of cables passes through the clamp 128 and is held by the clamp 128. This prevents the cable or cables from wobbling and/or rocking in the housing 2, and keeps the cable or cables tidy in the housing 2. The converter plate 112 also includes a connector holding member 129 near a front end portion of the upper edge portion of the converter plate 112. The connector holding member 129 protrudes away from the converter substrate 110 (that is, in the rightward direction). The connector holding member 129 holds a connector mounted at the leading end of the cable passing through the clamp 128 (see FIG. 15, described later). The connector holding member 129 is formed by cutting and bending up the converter plate 112 at right angles, but may be separate from the converter plate 112.

The converter plate 112 also has a screw hole 130 at the front end portion of the upper edge portion of the converter plate 112. Specifically, the screw hole 130 is disposed at a position corresponding to a corresponding one of the through holes 32 of the upper side panel 24 of the front side plate 13. The screw hole 130 receives a corresponding one of the screws 149 to fix the converter plate 112 to the upper side panel 24. The converter plate 112 also includes a leg 131 at a lower end portion of the front edge portion of the converter plate 112. The leg 131 protrudes in the frontward direction. The leg 131 has a through hole 132 at a position corresponding to a corresponding one of the screw holes 16 of the extension 15 of the bottom plate 9. The through hole 132 receives a corresponding one of the screws 143 to fix the converter plate 112 to the bottom plate 9.

The converter plate 112 also includes an engagement plate 133 at a rear edge portion of the converter plate 112. The engagement plate 133 protrudes toward the converter substrate 110 (that is, in the leftward direction) and faces the rear side plate 12 of the housing 2. The engagement plate 133 is formed by bending the converter plate 112 at right angles, but may be separate from the converter plate 112. The engagement plate 133 has a hole 134 at a lower end portion of the engagement plate 133. The hole 134 is engaged with a corresponding one of the protrusions 21, which are formed on the rear side plate 12. The hole 134 has a width W. Within the width W, movement of the protrusion 21 in the directions perpendicular to the converter substrate 110 (that is, in the rightward and leftward directions) is restricted. That is, the width W of the hole 134 in the rightward and leftward directions is approximately the same as the diameter of the cylindrical protrusion 21. It is to be noted, however, that there is a small gap left between the hole 134 and the protrusion 21 so that the protrusion 21 is smoothly slidable in the hole 134. Also, the hole 134 has a longitudinal length in the directions perpendicular to the main substrate 3 (that is, in the upward and downward directions). The longitudinal length is greater than the width W, and the hole 134 is open on its lower end portion. Also, the hole 134 has an arcuate shape at an upper end portion of the hole 134, and the arcuate shape coincides with the side surface of the protrusion 21. With this configuration, the arcuate shape constitutes an abutting portion 135, which abuts on the side surface of the protrusion 21 with the connectors 39, 40, and 41 of the main substrate 3 respectively connected to the connectors 114, 115, and 116 of the converter substrate 110 completely.

A screw hole 136 is formed near an upper end portion of the engagement plate 133. Specifically, the screw hole 136 is disposed at a position corresponding to a corresponding one of the through holes 22 of the rear side plate 12. The screw hole 136 receives a corresponding one of the screws 142 to fix the converter plate 112 to the rear side plate 12 (see FIG. 11). The engagement plate 133 also has a longitudinal opening 137 at an intermediate portion between the hole 134 and the screw hole 136. The intermediate portion corresponds to the opening 18 of the rear side plate 12 so that the opening 137 serves as a vent hole for the cooling air 20.

It is to be noted that the above-described configuration of the converter module 8 has been provided for example purposes only and is not intended in a limiting sense.

5. Procedure for Assembly of Motor Control Apparatus

By referring to FIGS. 9 to 16, a procedure for assembly of the motor control apparatus 1 (that is, a method for producing the motor control apparatus 1) will be described. It is to be noted that in FIGS. 9 to 16, the screws are not at the positions where the screws are supposed to be after the components of the motor control apparatus 1 are assembled together. It is also to be noted that each of the substrate modules 6, 7, and 8 has been assembled in advance.

Figure 9:
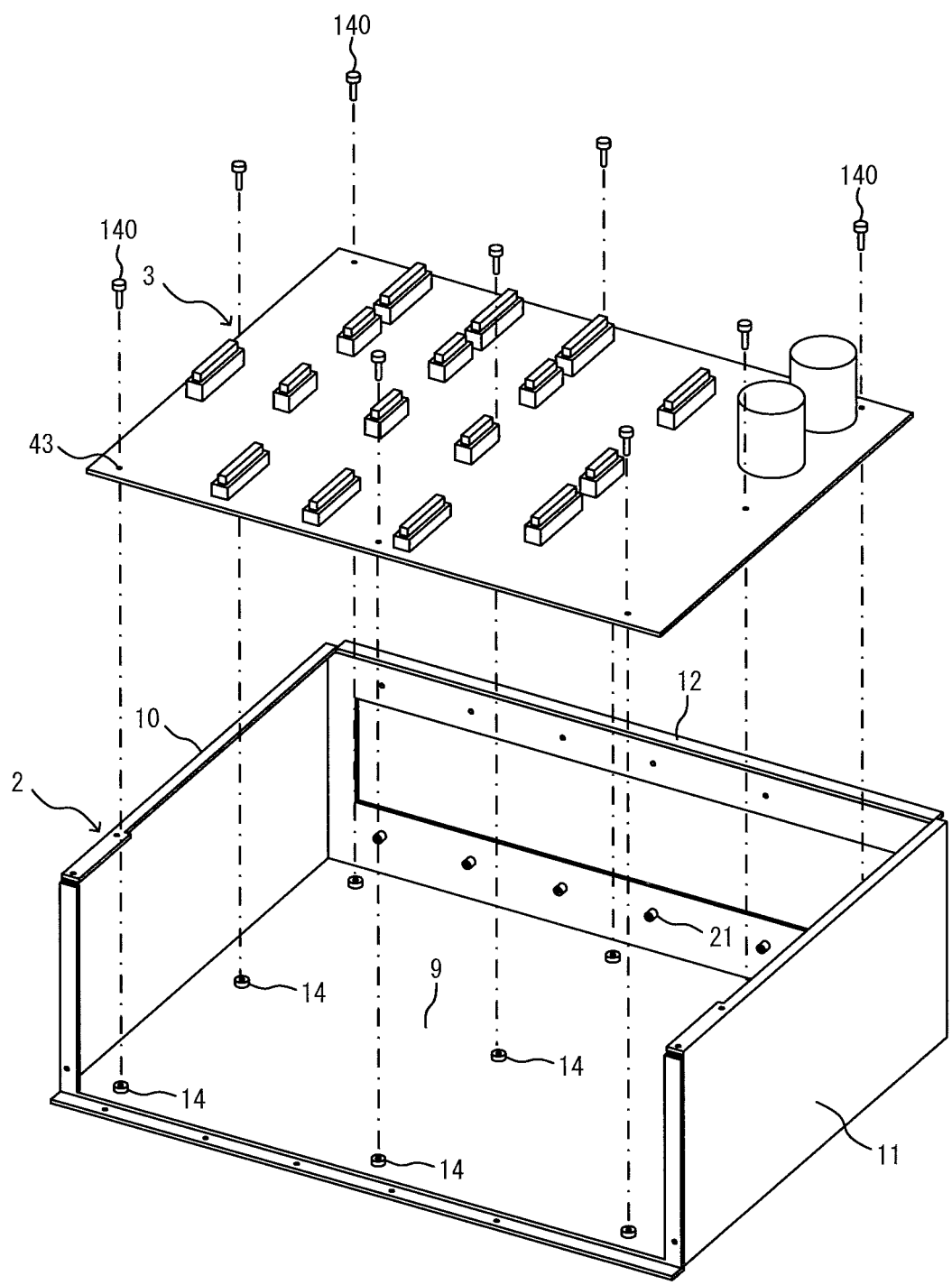
FIG. 9 illustrates an example procedure for assembly of the motor control apparatus.

First, as illustrated in FIG. 9, a plurality of screws 140 (nine screws 140 in the illustrated embodiment) are made to pass through the respective through holes 43 of the main substrate 3 and screwed into the respective bosses 14 of the bottom plate 9. Thus, the main substrate 3 is mounted on the bottom plate 9 of the housing 2.

Figure 10:
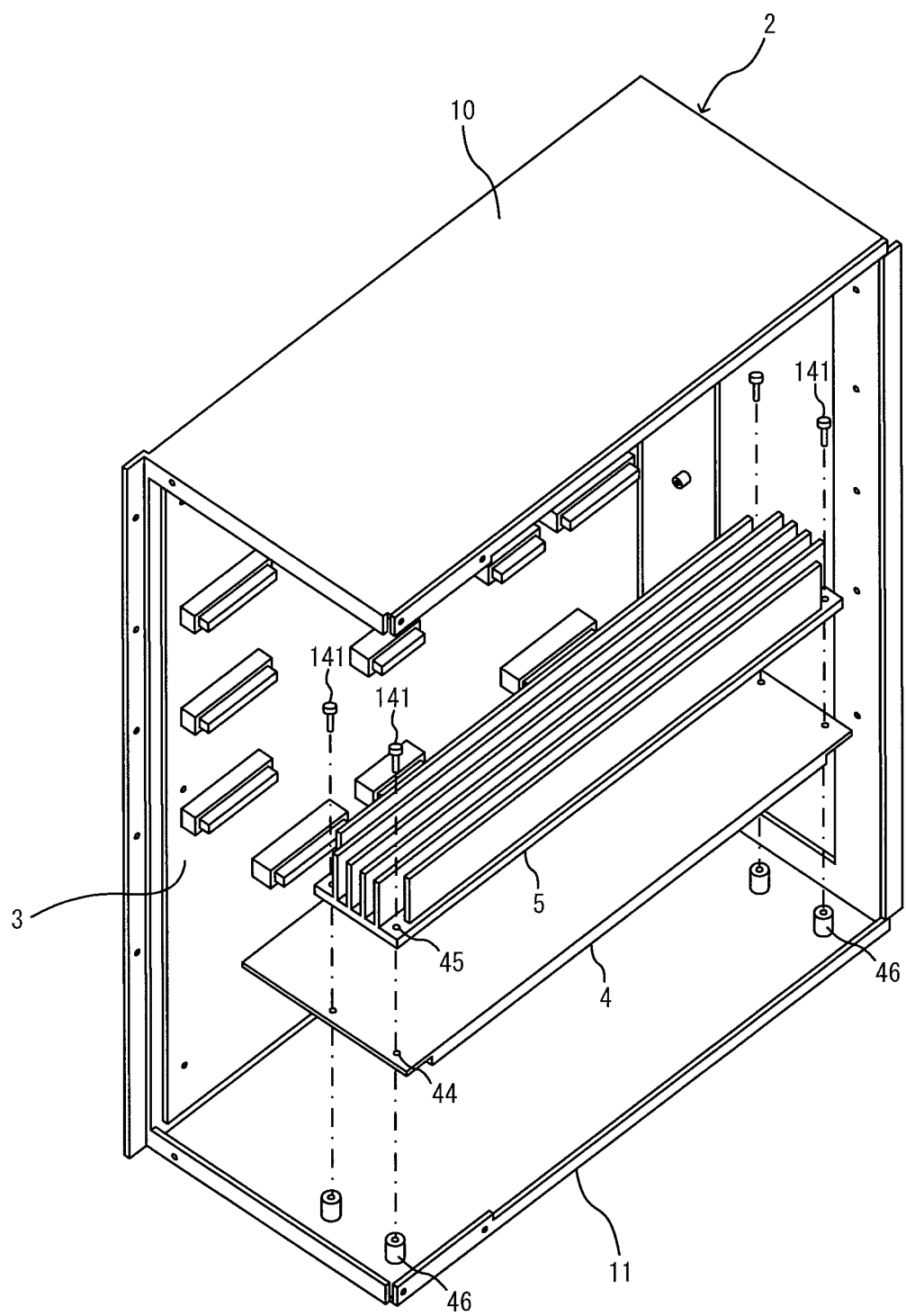
FIG. 10 illustrates an example procedure for assembly of the motor control apparatus.

Next, as illustrated in FIG. 10, a plurality of screws 141 (four screws 141 in the illustrated embodiment) are made to pass through the respective through holes 45 of the heat sink 5 and the respective through holes 44 on the regenerative resistor 4, and screwed into the respective bosses 46 of the right side plate 11. Thus, the heat sink 5 and the regenerative resistor 4 are tightened together and mounted on the inner surface of the right side plate 11 of the housing 2.

Figure 11:
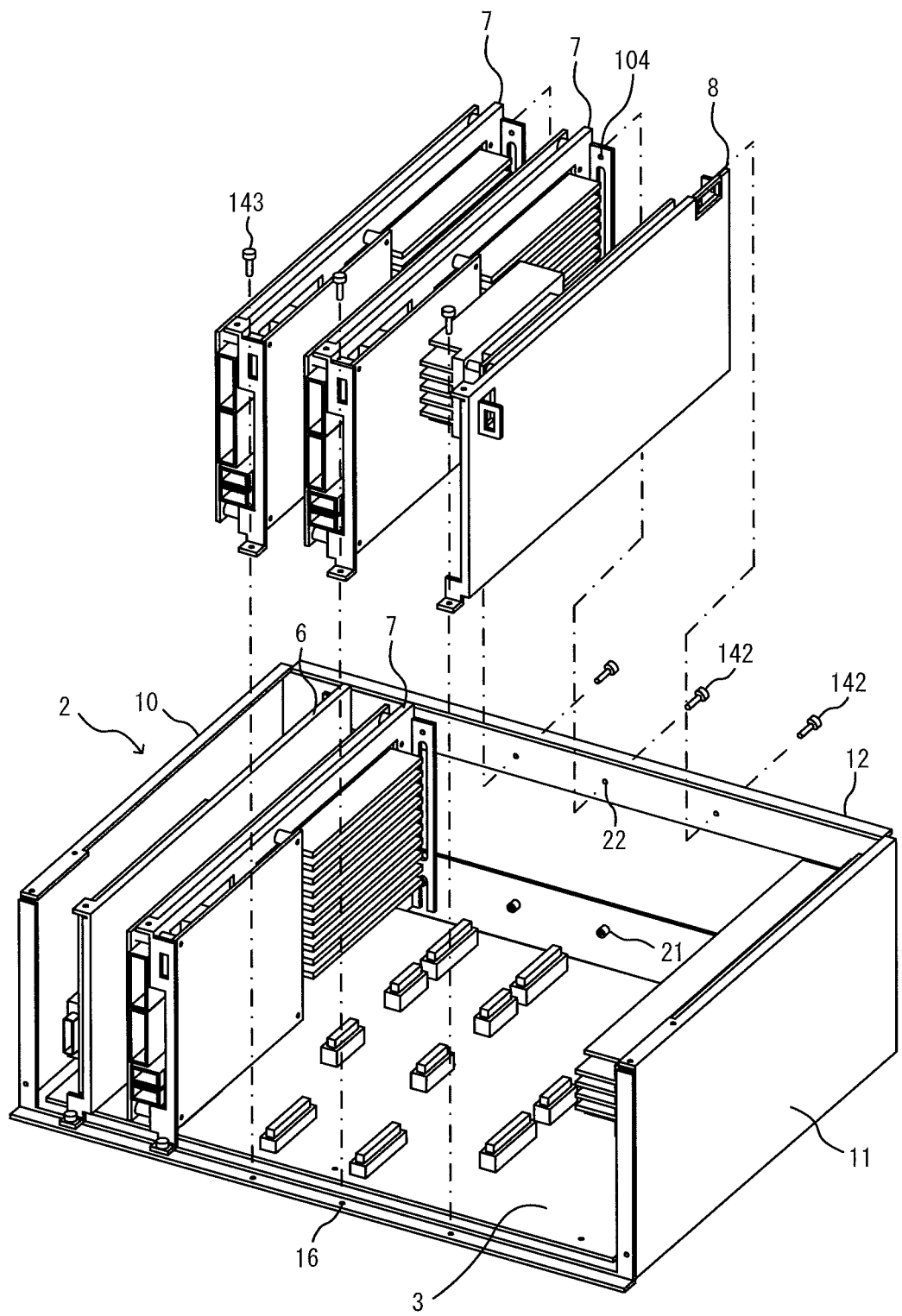
FIG. 11 illustrates an example procedure for assembly of the motor control apparatus.
Figure 12:
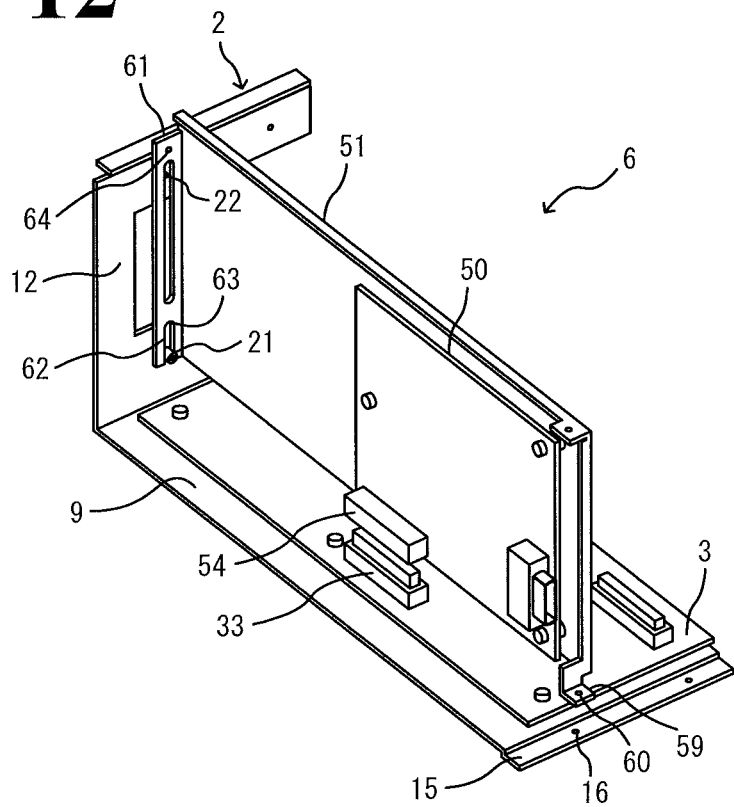
FIG. 12 illustrates an example procedure for assembly of the motor control apparatus.
Figure 13:
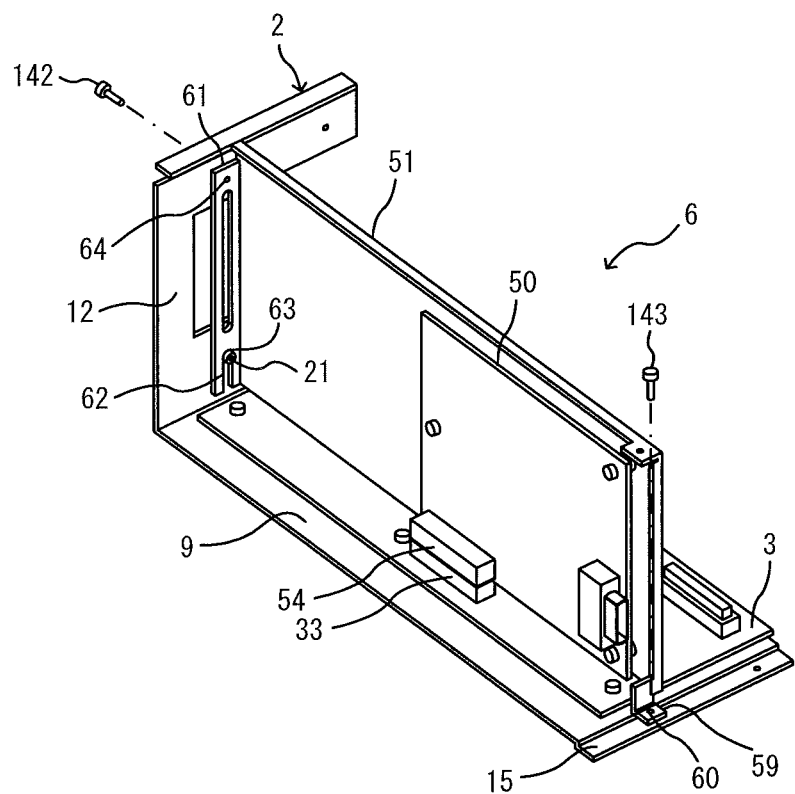
FIG. 13 illustrates an example procedure for assembly of the motor control apparatus.

Next, as illustrated in FIG. 11, the interface module 6, the three inverter modules 7, and the converter module 8 are inserted into the housing 2 and made to stand upright on the main substrate 3. Then, the substrate modules 6, 7, and 8 are fixed to the housing 2 with the screws 142 and the screws 143. Specifically, as illustrated in FIG. 12 (in which the interface module 6 is taken as an example), the protrusion 21 of the rear side plate 12 of the housing 2 is engaged with the hole 62 on the engagement plate 61 of the interface plate 51; then, with the protrusion 21 engaged with the hole 62, the interface module 6 is moved toward the main substrate 3. By sliding the protrusion 21 in the hole 62 with the protrusion 21 engaged with the hole 62, the interface module 6 is guided to a position at which the connector 33 of the main substrate 3 and the connector 54 of the interface substrate 50 are connected to each other properly. It is to be noted that the positioning of the interface module 6 in the frontward and rearward directions is performed by bringing the engagement plate 61 of the interface plate 51 into contact with the rear side plate 12 of the housing 2. Then, as illustrated in FIG. 13, the connector 33 and the connector 54 are brought into connection to each other, while at the same time the abutting portion 63 of the hole 62 comes into contact with the side surface of the protrusion 21 so that the movement of the interface module 6 toward the main substrate 3 is restricted. Also at the same time, the leg 59 of the interface plate 51 comes into contact with the extension 15 of the bottom plate 9.

Then, the screw 142 is made to pass through the through holes 22 of the rear side plate 12 and screwed into the screw hole 64 of the interface plate 51. Thus, the interface plate 51 is fixed to the rear side plate 12. Also, the screw 143 is made to pass through the through hole 60 of the leg 59 of the interface plate 51 and screwed into the screw hole 16 of the extension 15 of the bottom plate 9. Thus, the interface plate 51 is fixed to the bottom plate 9. In this manner, the interface module 6 is mounted on the housing 2.

The procedure illustrated in FIGS. 12 and 13 for assembly of the interface module 6 also applies in the inverter module 7 and the converter module 8.

Figure 14:
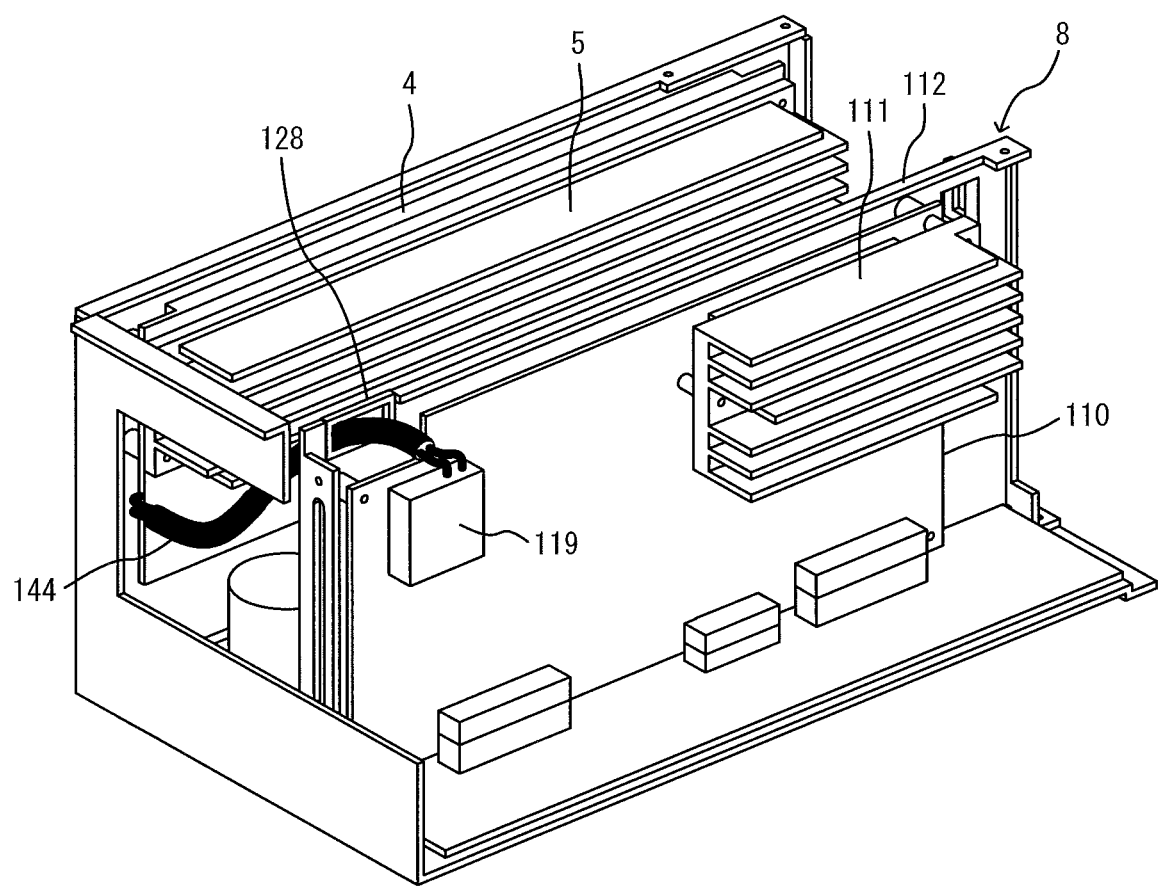
FIG. 14 illustrates an example procedure for assembly of the motor control apparatus.

Next, as illustrated in FIG. 14, a regenerative resistor cable 144 is made to pass through the clamp 128 of the converter module 8, and connected at one end to the regenerative resistor 4 and at the other end to the electronic component 119 of the converter substrate 110.

Figure 15:
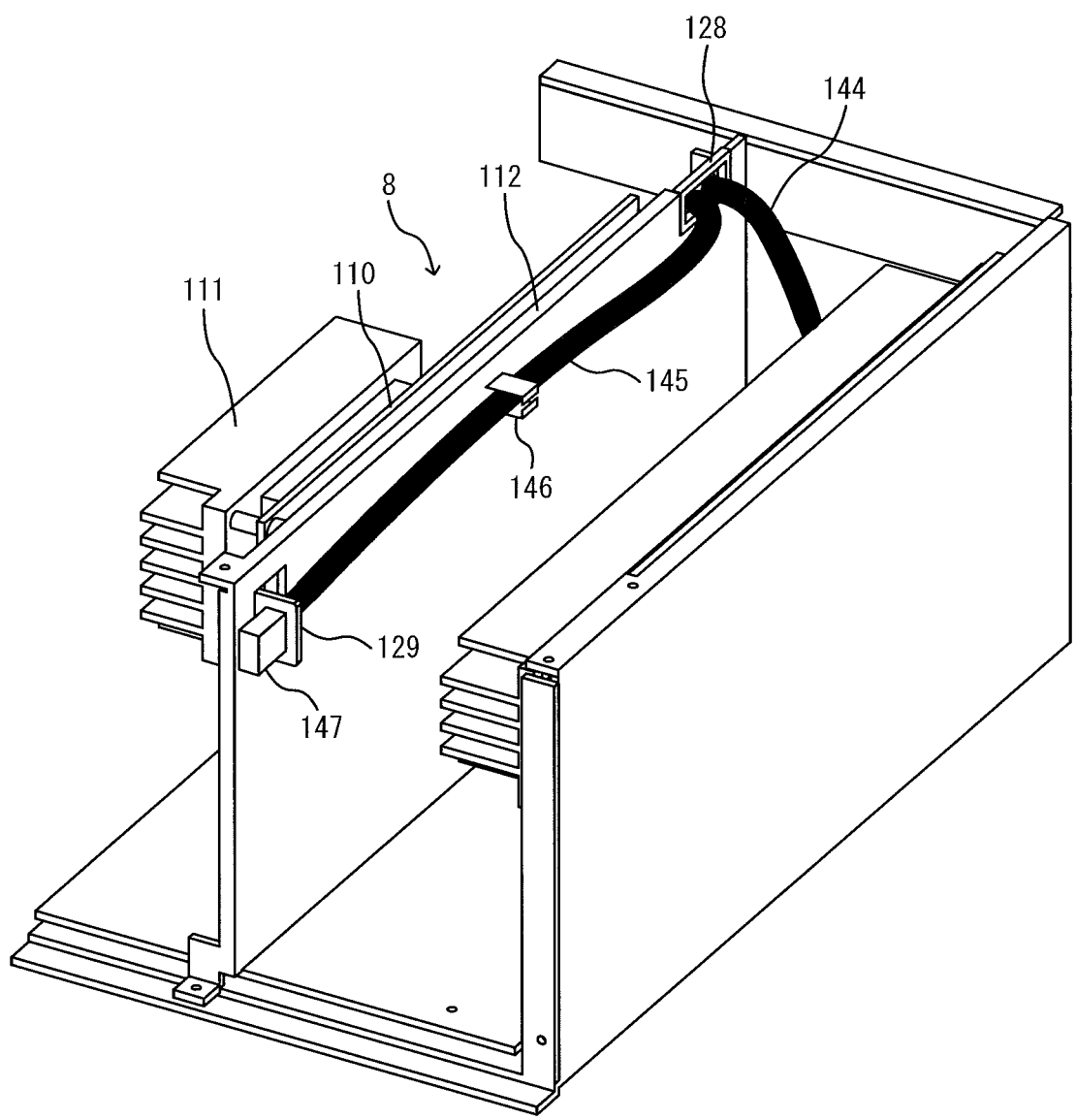
FIG. 15 illustrates an example procedure for assembly of the motor control apparatus.

Next, as illustrated in FIG. 15, a main substrate cable 145 is made to pass through the clamp 128 of the converter module 8 and through a clamp 146, which is disposed on the surface of the converter plate 112 opposite to the converter substrate 110. Then, a connector 147, which is disposed at one end of the main substrate cable 145, is attached to the connector holding member 129 of the converter plate 112. Then, another connector (not illustrated) disposed at the other end of the main substrate cable 145 is connected a corresponding electronic component disposed on the main substrate 3.

Figure 16:
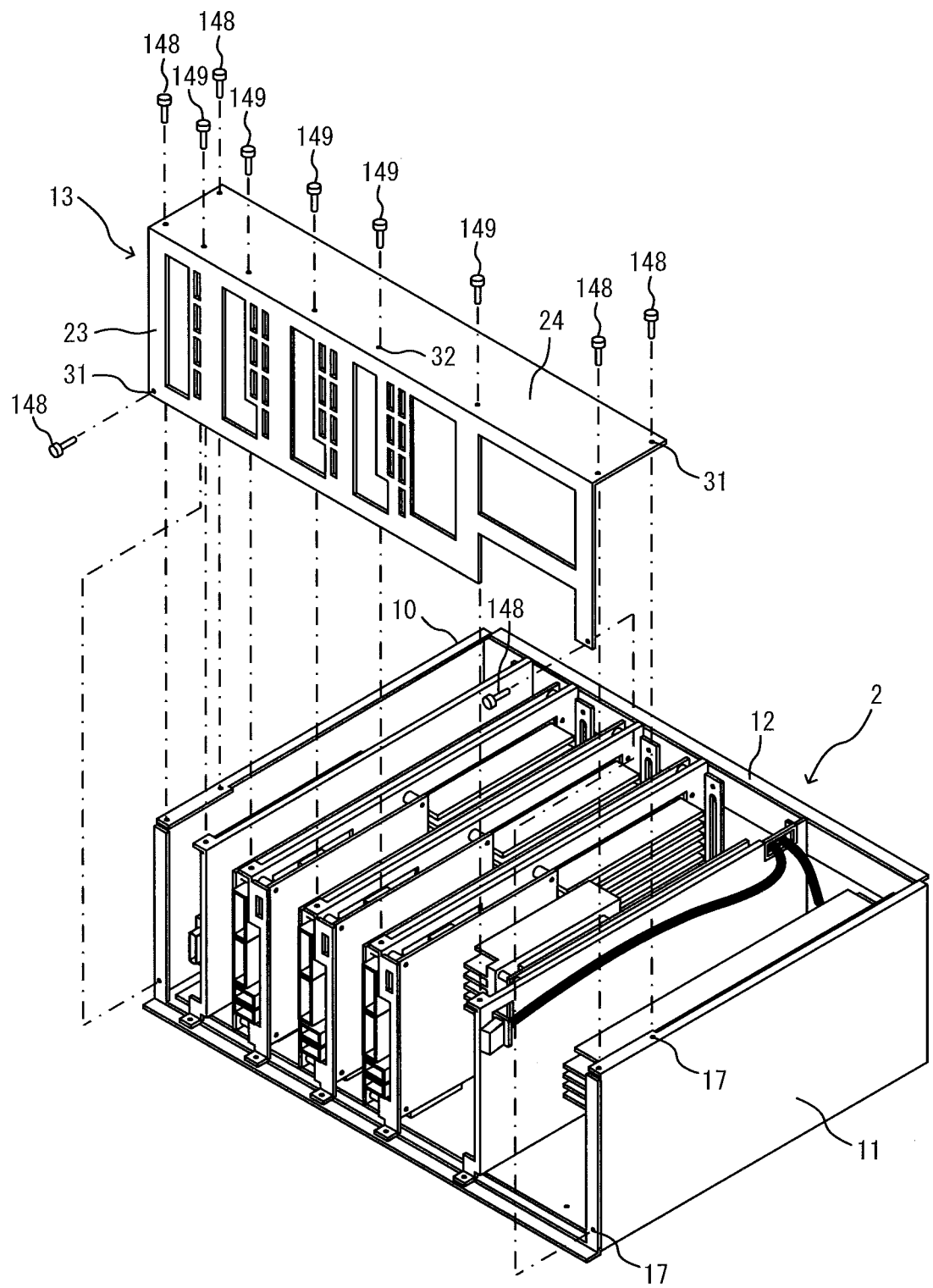
FIG. 16 illustrates an example procedure for assembly of the motor control apparatus.

Next, as illustrated in FIG. 16, a plurality of screws 148 (six screws 148 in the illustrated embodiment) are made to pass through the respective through holes 31 of the front side panel 23 and the upper side panel 24 of the front side plate 13, and screwed into the respective screw holes 17 of the left side plate 10 and the right side plate 11. Thus, the front side plate 13 is mounted on the left side plate 10 and the right side plate 11. Then, a plurality of screws 149 (five screws 149 in the illustrated embodiment) are made to pass through the respective through holes 32 of the upper side panel 24 of the front side plate 13, and screwed into the respective screw holes 58, 97, and 130 respectively of the substrate modules 6, 7, and 8. Thus, the front side plate 13 is mounted on the upper edge portions of the substrate modules 6, 7, and 8. In this manner, the motor control apparatus 1 is assembled.

6. Advantageous Effects of the Embodiment

As has been described hereinbefore, the motor control apparatus 1 according to this embodiment includes the housing 2, the main substrate 3, the interface module 6, the inverter module 7, and the converter module 8. The housing 2 includes the bottom plate 9 and the plurality of side plates 10, 11, 12, and 13, which are perpendicular to the bottom plate 9. The main substrate 3 is parallel with the bottom plate 9. The interface module 6 stands upright on the main substrate 3 and includes the interface substrate 50 and the interface plate 51, to which the interface substrate 50 is fixed. The inverter module 7 stands upright on the main substrate 3 and includes the inverter power substrate 70, the inverter control substrate 71, and the inverter plate 73, to which the substrates 70 and 71 are fixed. The converter module 8 stands upright on the main substrate 3 and includes the converter substrate 110 and the converter plate 112, to which the converter substrate 110 is fixed. Among the plurality of side plates 10, 11, 12, and 13, the rear side plate 12 includes the protrusions 21, which protrude toward the inside space of the housing 2. The interface plate 51, the inverter plate 73, and the converter plate 112 respectively include the holes 62, 102, and 134, which are engaged with the respective protrusions 21.

In this embodiment, when the substrate modules 6, 7, and 8 are mounted on the main substrate 3, the protrusions 21 of the rear side plate 12 are engaged with the holes 62, 102, and 134 respectively of the substrate modules 6, 7, and 8. This ensures that the substrate modules 6, 7, and 8 are guided to desired positions (that is, to positions at which the connectors of the main substrate 3 are properly connected to the respective connectors of the substrate modules 6, 7, and 8). In this respect, it is difficult or laborious to perform positioning of the connectors of the main substrate 3 relative to the connectors of the substrate modules 7 and 8 in that a plurality of connectors are arranged side by side in the frontward and rearward directions on the inverter module 7 and the converter module 8, and further in that a plurality of substrates are arranged side by side in the rightward and leftward directions on the inverter module 7. This situation is significantly effectively dealt with by the guiding function implemented by the engagement of the protrusions 21 with the holes 102 and 134. The guiding function also serves as a guide for the substrate modules 6, 7, and 8 when removed from the main substrate 3 by providing the directions in which the substrate modules 6, 7, and 8 are pulled out from the main substrate 3. This improves workability at the time of assembly and maintenance of the motor control apparatus 1. Thus, there is no need for guide members on the inner surfaces of the side plates 10, 11, 12, and 13 of the housing 2 (example guide members including a plate with guide grooves, and a guide rail). This reduces the size and weight of the motor control apparatus 1, and also reduces the cost associated with the motor control apparatus 1.

Also in this embodiment, the holes 62, 102, and 134 have the width W. Within the width W, movement of the protrusions 21 in the directions perpendicular to the substrates 50, 70, 71, and 110 is restricted. Also, the holes 62, 102, and 134 each have a length greater than the width W in the directions perpendicular to the main substrate 3.

This ensures that when the substrate modules 6, 7, and 8 are mounted on or removed from the main substrate 3, the substrate modules 6, 7, and 8 are guided in the directions perpendicular to the main substrate 3 while being subjected to positioning such that movement of the substrate modules 6, 7, and 8 in the directions perpendicular to the substrates 50, 70, 71, and 110 is restricted. This further improves workability at the time of assembly and maintenance of the motor control apparatus 1.

Also in this embodiment, the main substrate 3 includes the connectors 33, 35, 36, 37, 38, 39, 40, and 41. The substrates 50, 70, 71, and 110 of the substrate modules 6, 7, and 8 include the connectors 54, 76, 77, 78, 87, 114, 115, and 116, which are respectively connected to the connectors 33, 35, 36, 37, 38, 39, 40, and 41. The holes 62, 102, and 134 respectively include the abutting portions 63, 103, and 135, which abut on the side surface of the protrusion 21 with the connectors 33, 35, 36, 37, 38, 39, 40, and 41 respectively connected to the connectors 54, 76, 77, 78, 87, 114, 115, and 116 completely.

This ensures that when the substrate modules 6, 7, and 8 are mounted on the main substrate 3, the holes 62, 102, and 134 function as stoppers. This prevents the substrate modules 6, 7, and 8 from being pressed excessively, which may cause breakage or other damage to the connectors, the electronic components, and the substrates.

Also in this embodiment, the interface plate 51, the inverter plate 73, and the converter plate 112 are fixed, with the screws 143 and 142, to the bottom plate 9 and the rear side plate 12 with the abutting portions 63, 103, and 135 abutting on the side surface of the protrusion 21.

Thus, the plates 51, 73, and 112 are fixed to two orthogonal surfaces of the housing 2. This ensures that the plates 51, 73, and 112 function as reinforcement members, increasing the rigidity of the housing 2 such that vibration of the housing 2 is minimized. Further in this embodiment, the upper edge portions of the plates 51, 73, and 112 are fixed to the upper side panel 24 of the front side plate 13 with the screws 149, with the result that the plates 51, 73, and 112 are fixed to three orthogonal surfaces of the housing 2. This further increases the rigidity of the housing 2 such that vibration of the housing 2 is eliminated or minimized.

Also in this embodiment, the inverter module 7 includes the heat sink 72. The heat sink 72 is fixed to the inverter plate 73 and cools the power modules 79, which are disposed on the inverter power substrate 70. The converter module 8 includes the heat sink 111. The heat sink 111 is fixed to the converter plate 112 and cools the heat dissipating component 117, which is disposed on the converter substrate 110.

This ensures that the electronic components 79 and 117, which generate heat on the substrates 70 and 110, are cooled efficiently. Also, the heat sink 72 is fixed to the plate 73 together with the substrate 70, thus being formed into a module. Similarly, the heat sink 111 is fixed to the plate 112 together with the substrate 110, thus being formed into a module. This ensures that once the substrate modules 7 and 8 are assembled, the substrate modules 7 and 8 can be attached to and detached from the housing 2 on a module basis. This, in turn, improves handleability of the substrate modules 7 and 8, resulting in a further improvement of workability at the time of assembly and maintenance of the motor control apparatus 1.

Also in this embodiment, the inverter module 7 includes the inverter power substrate 70 and the inverter control substrate 71. The inverter power substrate 70 is disposed on one surface of the inverter plate 73, and the inverter control substrate 71 is disposed on the opposite surface of the inverter plate 73.

This ensures that the space on the front surface and the rear surface of the inverter power substrate 70 is utilized more effectively, providing the inverter module 7 with a more compact structure. Also, the inverter plate 73 is disposed between the inverter power substrate 70 and the inverter control substrate 71. This ensures that the substrates 70 and 71 are spaced apart from each other and that the inverter plate 73, which is made of metal, functions as a shield member to protect the inverter control substrate 71 from electromagnetic waves emitted from the inverter power substrate 70, minimizing the influence of noise caused by the electromagnetic waves.

Also in this embodiment, the side plate 12, on which the protrusions 21 are disposed, has the opening 18. The opening 18 has a length covering the plurality of substrate modules 6, 7, and 8.

In the motor control apparatus 1 according to this embodiment, no guide members are provided on the housing 2. This enables the opening 18 to be large enough to span over the plurality of substrate modules 6, 7, and 8. This, in turn, further reduces the weight of the motor control apparatus 1. Additionally, the opening 18 functions as a vent hole for the cooling air 20, resulting in improved heat dissipation performance (coolability) of the housing 2.

Also in this embodiment, the motor control apparatus 1 includes the converter module 8, the inverter module 7, and the interface module 6. The converter module 8 includes the converter substrate 110, which converts first AC power supplied from the AC power source into DC power. The inverter module 7 includes the inverter power substrate 70 and the inverter control substrate 71. The inverter power substrate 70 converts the DC power into second AC power and supplies the second AC power to the motor. The inverter control substrate 71 controls power conversion performed by the inverter power substrate 70. The interface module 6 includes the interface substrate 50.

This makes the motor control apparatus 1 a motor control apparatus that is reduced in size, weight, and cost and that provides improved workability at the time of assembly and maintenance of the motor control apparatus.

The method according to this embodiment for producing the motor control apparatus 1 includes: placing the main substrate 3 in parallel with the bottom plate 9 of the housing 2; and placing the substrate modules 6, 7, and 8 upright on the main substrate 3 by: bringing the protrusions 21 on the rear side plate 12 of the housing 2 into engagement with the respective holes 62, 102, and 134 respectively of the substrate modules 6, 7, and 8; and with the protrusions 21 engaged with holes 62, 102, and 134, moving the substrate modules 6, 7, and 8 in a direction perpendicular to the bottom plate 9.

This ensures that the substrate modules 6, 7, and 8 are guided to desired positions (that is, to positions at which the connectors of the main substrate 3 are properly connected to the respective connectors of the substrate modules 6, 7, and 8). Also when the substrate modules 6, 7, and 8 are removed from the main substrate 3, the substrate modules 6, 7, and 8 can be guided in the direction in which the substrate modules 6, 7, and 8 are pulled out from the main substrate 3. This improves workability at the time of assembly and maintenance of the motor control apparatus 1.

7. Modifications

Modifications of the above-described embodiment will be described below.

7-1. Protrusions and Holes Provided on Both Sides in Frontward and Rearward Directions In the above-described embodiment, the protrusions 21 are provided solely on the rear side plate 12 of the housing 2 so that the protrusions 21 are engaged with the holes 62, 102, and 134 on the rear side of the substrate modules 6, 7, and 8. In another possible modification, the protrusions 21 may also be provided on the front side plate 13 of the housing 2 so that the protrusions 21 are engaged with the holes disposed both on the front and rear sides of the substrate modules 6, 7, and 8. By referring to FIG. 17, an example configuration of this modification will be described.

Figure 17:
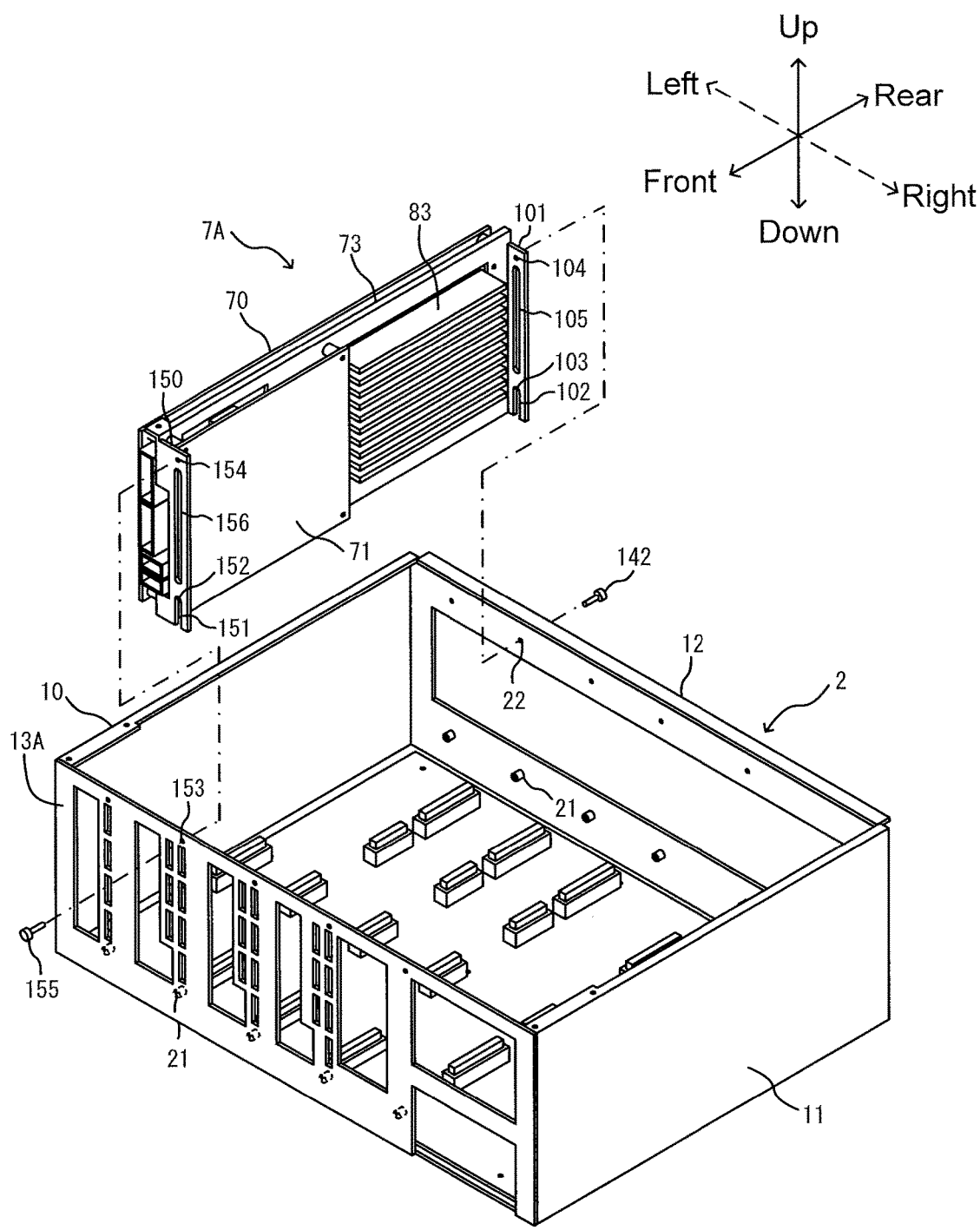
FIG. 17 illustrates an example procedure for assembly of a motor control apparatus according to a modification in which protrusions and holes are provided on both sides in frontward and rearward directions.

FIG. 17 illustrates an example in which the inverter module is mounted on the housing. Specifically, in an inverter module 7A according to this modification, the inverter plate 73 includes an engagement plate 150 at a front edge portion of the inverter plate 73. The engagement plate 150 protrudes toward the inverter control substrate 71 (that is, in the rightward direction) and faces the front side plate 13 of the housing 2A.

The engagement plate 150 has a configuration similar to the configuration of the engagement plate 101, which is disposed on the rear side of the engagement plate 150. Specifically, the engagement plate 150 has a hole 151 at a lower end portion of the engagement plate 150. The hole 151 is engaged with a corresponding one of the protrusions 21 on the front side plate 13A. The hole 151 has a shape similar to the shape of the hole 102, that is, the hole 151 has an abutting portion 152 at an upper end portion of the hole 151. The engagement plate 150 also has a screw hole 154 near an upper end portion of the engagement plate 150. Specifically, the screw hole 154 is disposed at a position corresponding to a corresponding one of through holes 153 on the front side plate 13A. The screw hole 154 receives a corresponding one of screws 155 to fix the inverter plate 73 to the front side plate 13A. The engagement plate 150 also has a longitudinal opening 156 between the hole 151 on the engagement plate 150 and the screw hole 154. The longitudinal opening 156 serves as a vent hole for the cooling air 20.

It is to be noted that in this modification, the front side plate 13 of the housing 2A is fixed to the left side plate 10 and the right side plate 11. It is also to be noted that other substrate modules, not illustrated, are similar in configuration to the inverter module 7A. This modification is otherwise similar in configuration to the above-described embodiment.

Thus, the inverter module 7A according to this modification is guided at the rear edge portion of the inverter module 7A, as well as at the front edge portion of the inverter module 7A (the same applies in other substrate modules in this modification). This eliminates or minimizes wobbling and positional displacement of the front side of the inverter module 7A in the rightward and leftward directions. This, in turn, further increases the accuracy of positioning implemented by the guiding functions, resulting in a further improvement of workability at the time of assembly and maintenance of the motor control apparatus 1.

7-2. Single Hole is Engaged with Plurality of Protrusions

By referring to FIGS. 18 and 19, an example configuration of another modification will be described.

Figure 18:
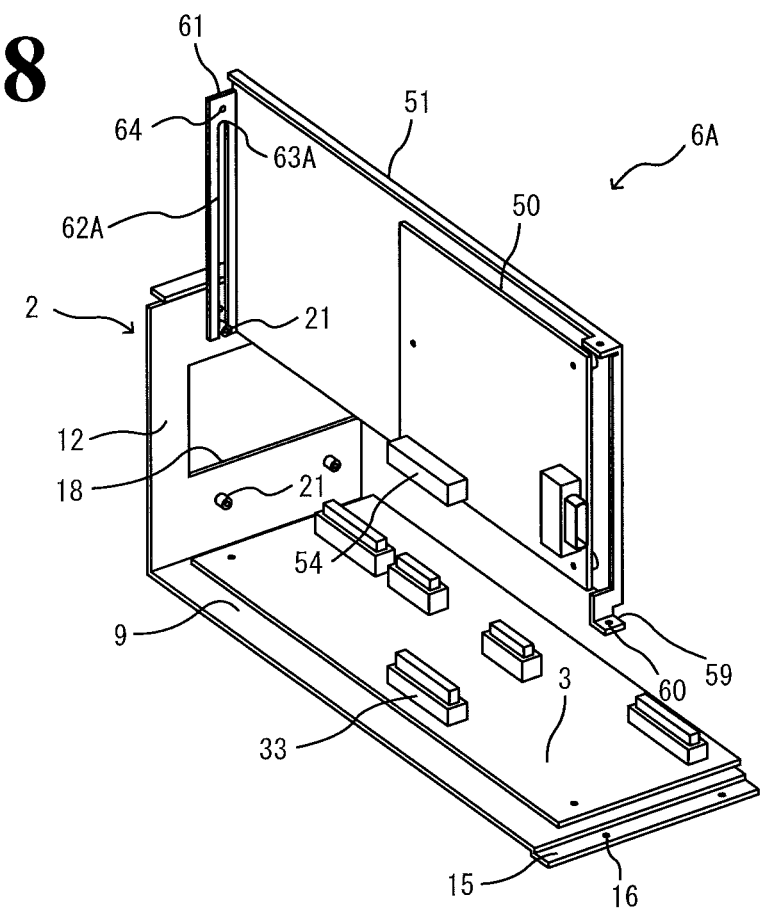
FIG. 18 illustrates an example procedure for assembly of a motor control apparatus according to a modification in which a single hole is engaged with a plurality of protrusions.
Figure 19:
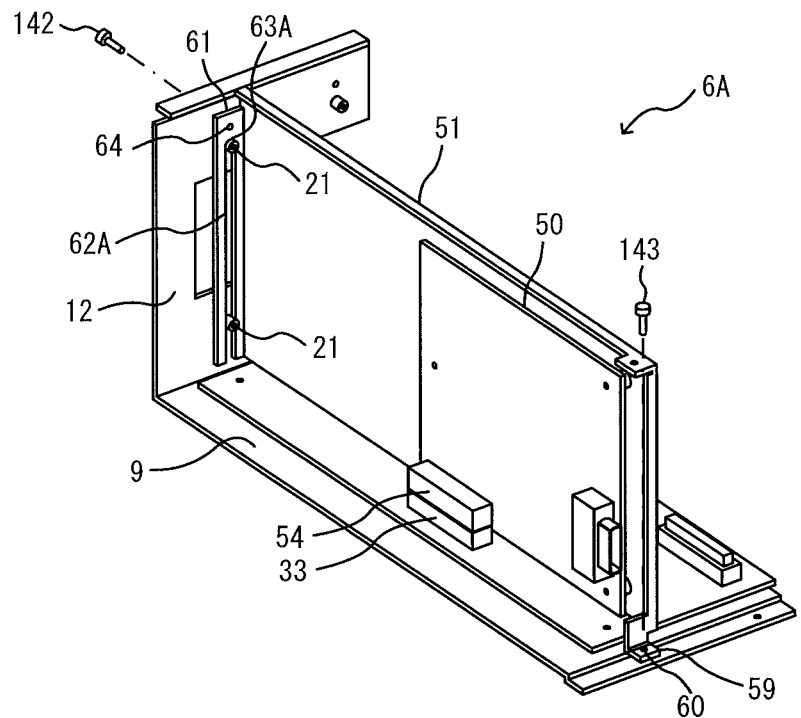
FIG. 19 illustrates an example procedure for assembly of a motor control apparatus according to a modification in which a single hole is engaged with a plurality of protrusions.

As illustrated in FIGS. 18 and 19, an interface module 6A according to this modification has a hole 62A on the engagement plate 61 of the interface plate 51. The hole 62A has a longitudinal length in the upward and downward directions. Specifically, the longitudinal length of the hole 62A extends between the lower end portion of the engagement plate 61 and a position near the screw hole 64. On the rear side plate 12 of the housing 2, a plurality of protrusions 21 (two protrusions 21 in the illustrated embodiment) are formed. Specifically, one of the protrusions 21 is disposed at a position further upward than the opening 18, and the other protrusion 21 is disposed at a position further downward than the opening 18. It is to be noted that three or more protrusions 21 may be provided on the rear side plate 12 in the upward and downward directions.

As illustrated in FIG. 18, the upper protrusion 21 of the rear side plate 12 is brought into engagement with the hole 62A, and with the upper protrusion 21 engaged with the hole 62A, the interface module 6A is moved toward the main substrate 3. Then, the lower protrusion 21 of the rear side plate 12 is brought into engagement with the hole 62A, so that the two protrusions 21 slide in the hole 62A. Thus, the interface module 6A is accurately guided to a position at which the connector 33 of the main substrate 3 and the connector 54 of the interface substrate 50 are connected to each other properly. Then, as illustrated in FIG. 19, the connector 33 and the connector 54 are brought into connection with each other, so that the abutting portion 63A of the hole 62A abuts on the side surface of the protrusion 21 disposed above the abutting portion 63A. This ensures that movement of the interface module 6A toward the main substrate 3 is restricted. With the interface module 6A in this state, the interface plate 51 is fixed to the rear side plate 12 and the bottom plate 9 respectively with the screws 142 and 143.

It is to be noted that other substrate modules, not illustrated, are similar in configuration to the interface module 6A. This modification is otherwise similar in configuration to the above-described embodiment.

Thus, the hole 62A according to this modification has a comparatively long shape. This enables the interface module 6A to be guided over a longer distance (this applies in other substrate modules). Also in this modification, the hole 62A is engaged with the two protrusions 21 arranged in parallel with each other in the upward and downward directions. This configuration enables the interface module 6A to be more accurately guided in the directions in which the interface module 6A is attached to and detached from the housing 2. The above configuration also eliminates or minimizes wobbling and positional displacement of the interface module 6A in its rotation direction (an example rotation direction is an axis direction that axially passes through the protrusion 21 and that is parallel with the frontward and rearward directions). This further increases the accuracy of positioning implemented by the guiding functions, resulting in a further improvement of workability at the time of assembly and maintenance of the motor control apparatus 1.

7-3. Plurality of Holes are Engaged with Plurality of Protrusions

By referring to FIGS. 20 and 21, an example configuration of another modification will be described.

Figure 20:
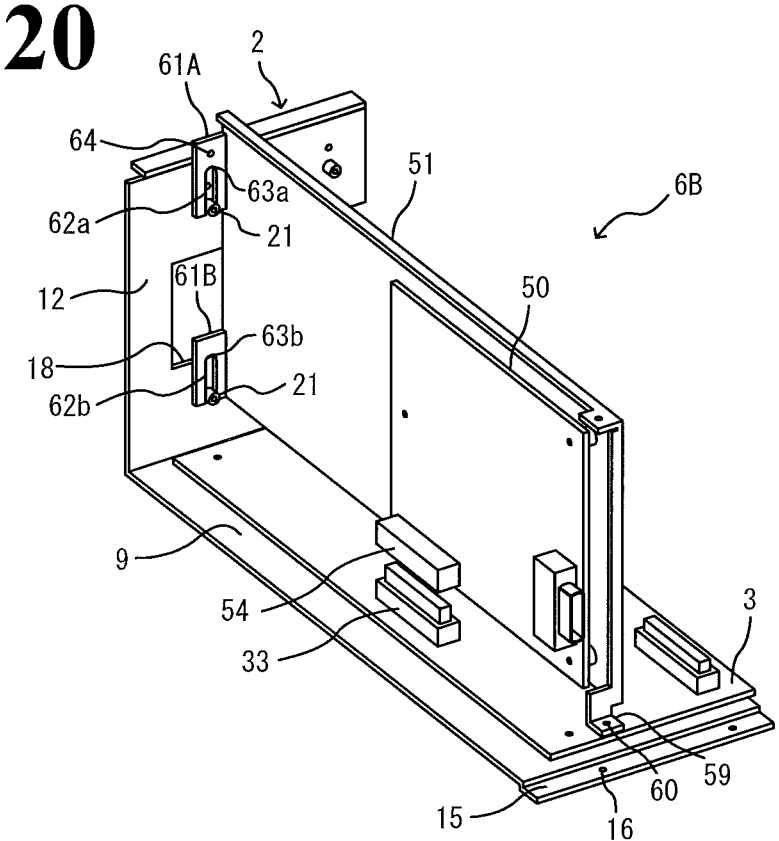
FIG. 20 illustrates an example procedure for assembly of a motor control apparatus according to a modification in which a plurality of holes are engaged with a plurality of respective protrusions.
Figure 21:
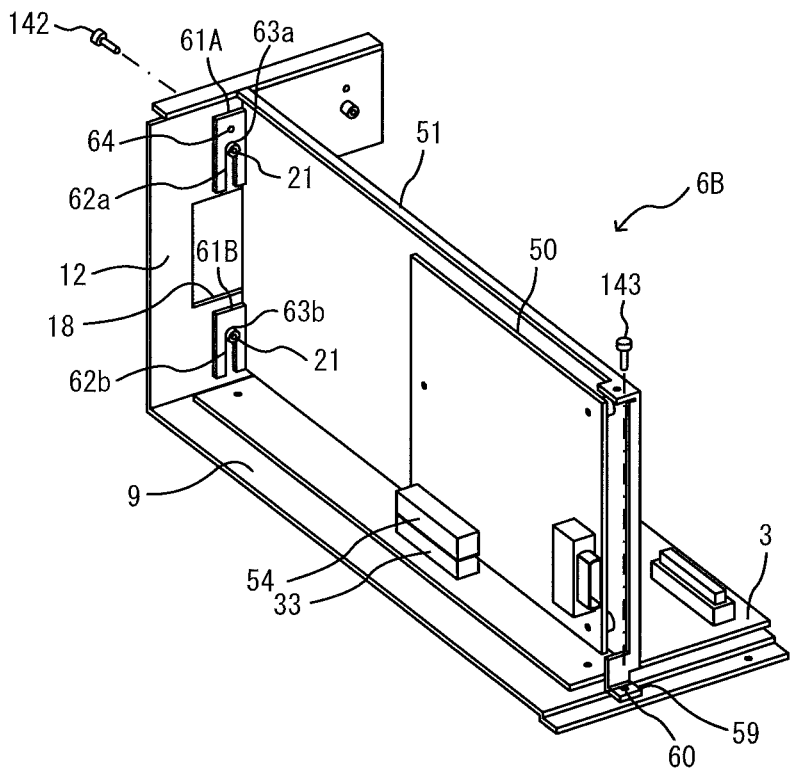
FIG. 21 illustrates an example procedure for assembly of a motor control apparatus according to a modification in which a plurality of holes are engaged with a plurality of respective protrusions.

As illustrated in FIGS. 20 and 21, in the interface module 6B according to this modification, the interface plate 51 includes two engagement plates 61A and 61B at a rear edge portion of the interface plate 51. The two engagement plates 61A and 61B are spaced apart from each other in the upward and downward directions by a distance approximately the same as the upward-downward dimension of the opening 18 of the rear side plate 12. The engagement plate 61A has a hole 62a, and the engagement plate 61B has a hole 62b. The holes 62a and 62b each have a shape similar to the shape of the hole 62 according to the above-described embodiment. That is, the hole 62a has an abutting portion 63a at an upper end portion of the hole 62a, and the hole 63b has an abutting portion 63b at an upper end portion of the hole 63b. On the rear side plate 12 of the housing 2, a plurality of protrusions 21 (two protrusions 21 in the illustrated embodiment) are formed. Specifically, one of the protrusions 21 is disposed at a position further upward than the opening 18, and the other protrusion 21 is disposed at a position further downward than the opening 18. It is to be noted that three or more protrusions 21 may be provided on the rear side plate 12 in the upward and downward directions.

As illustrated in FIG. 20, the two protrusions 21 on the rear side plate 12 are brought into engagement with the respective holes 62a and 62b, and with the two protrusions 21 engaged with the respective holes 62a and 62b, the interface module 6B is moved toward the main substrate 3. Thus, the interface module 6B is accurately guided to a position at which the connector 33 of the main substrate 3 and the connector 54 of the interface substrate 50 are connected to each other properly. Then, as illustrated in FIG. 21, the connector 33 and the connector 54 are brought into connection with each other, so that the abutting portion 63a of the hole 62a abuts on the side surface of the upper protrusion 21 and that the abutting portion 63b of the hole 62b abuts on the side surface of the lower protrusion 21. This ensures that movement of the interface module 6B toward the main substrate 3 is restricted. With the interface module 6B in this state, the interface plate 51 is fixed to the rear side plate 12 and the bottom plate 9 respectively with the screws 142 and 143.

It is to be noted that other substrate modules, not illustrated, are similar in configuration to the interface module 6B. This modification is otherwise similar in configuration to the above-described embodiment.

Thus, the holes 62a and 62b according to this modification are engaged with the respective two protrusions 21 arranged in parallel with each other in the upward and downward directions. This configuration enables the interface module 6B to be more accurately guided in the directions in which the interface module 6B is attached to and detached from the housing 2 (this applies in other substrate modules). The above configuration also eliminates or minimizes wobbling and positional displacement of the interface module 6B in its rotation direction (an example rotation direction is an axis direction that axially passes through the protrusion 21 and that is parallel with the frontward and rearward directions). This further increases the accuracy of positioning implemented by the guiding functions, resulting in a further improvement of workability at the time of assembly and maintenance of the motor control apparatus 1.

7-4. Other Hole Shapes and Other Protrusion Shapes

Figure 22:
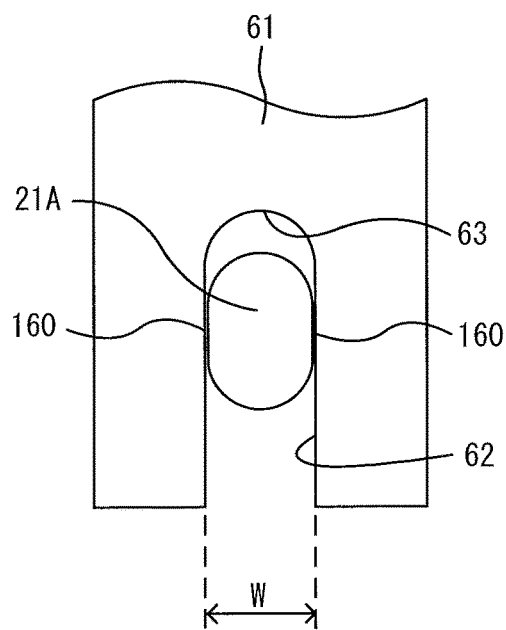
FIG. 22 illustrates example other shapes of the hole and the protrusion.
Figure 22:
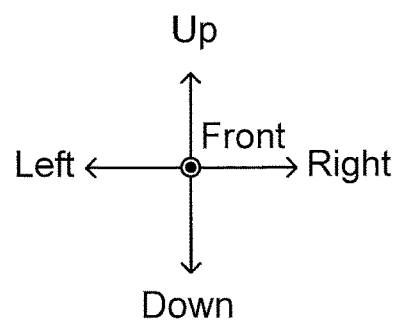

While in the above-described embodiment and modifications each protrusion 21 has a cylindrical shape, each protrusion 21 may have any other shapes. For example, it is possible to use a protrusion 21A illustrated in FIG. 22. The protrusion 21A has flat portions 160, one of the flat portions 160 being disposed on one side of the protrusion 21A in the width direction of the hole 62 (that is, the rightward or leftward direction), the other flat portion 160 being disposed on the other side of the protrusion 21A in the width direction of the hole 62. The width, W, of the hole 62 in the rightward and leftward directions is approximately the same as the width of the protrusion 21A at the flat portions 160. It is to be noted, however, that there is a small gap left between the hole 62 and the flat portions 160 so that the protrusion 21A is smoothly slidable in the hole 62. The protrusion 21A has arcuate shapes at an upper end portion and a lower end portion of the protrusion 21A, and the arcuate shapes coincide with the shape of the abutting portion 63 of the hole 62.

Figure 23:
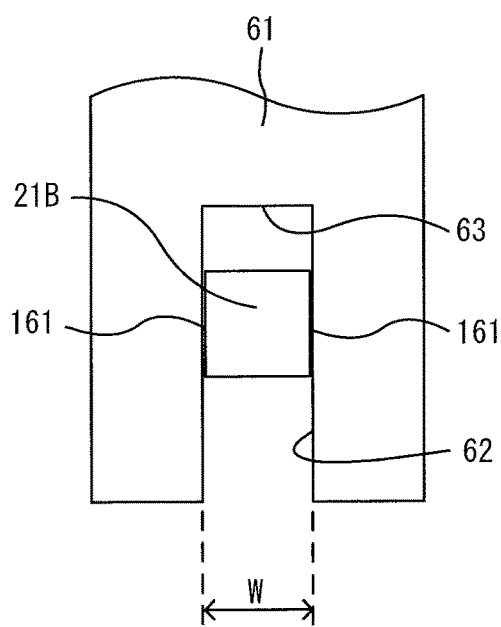
FIG. 23 illustrates example other shapes of the hole and the protrusion.
Figure 23:
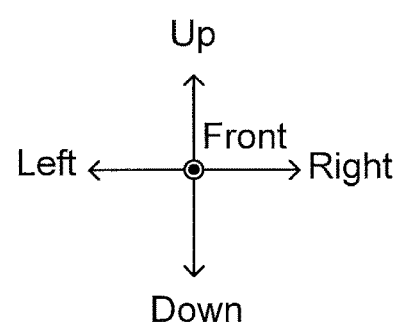

It is also possible to use a square protrusion 21B illustrated in FIG. 23. The protrusion 21B has flat portions 161, one of the flat portions 161 being disposed on one side of the protrusion 21B in the width direction of the hole 62 (that is, the rightward or leftward direction), and the other flat portion 161 being disposed on the other side of the protrusion 21B in the width direction of the hole 62. The width, W, of the hole 62 in the rightward and leftward directions is approximately the same as the width of the protrusion 21B. It is to be noted, however, that there is a small gap left between the hole 62 and the flat portions 161 so that the protrusion 21B is smoothly slidable in the hole 62. The abutting portion 63 of the hole 62 has a flat shape that coincides with the top surface of the protrusion 21B.

Thus, the flat portions 160 of the protrusion 21A according to this modification are fitted with the inner flat surface of the hole 62, and the flat portions 161 of the protrusion 21B according to this modification are fitted with the inner flat surface of the hole 62. This configuration enables the substrate modules 6, 7, and 8 to be more accurately guided in the directions in which the substrate modules 6, 7, and 8 are attached to and detached from the housing 2. The above configuration also eliminates or minimizes wobbling and positional displacement of the substrate modules 6, 7, and 8 in their rotation directions (an example rotation direction is an axis direction that axially passes through the protrusion 21A or 21B and that is parallel with the frontward and rearward directions). This further increases the accuracy of positioning implemented by the guiding functions, resulting in a further improvement of workability at the time of assembly and maintenance of the motor control apparatus 1.

7-5. Depression Shape Hole

Figure 24:
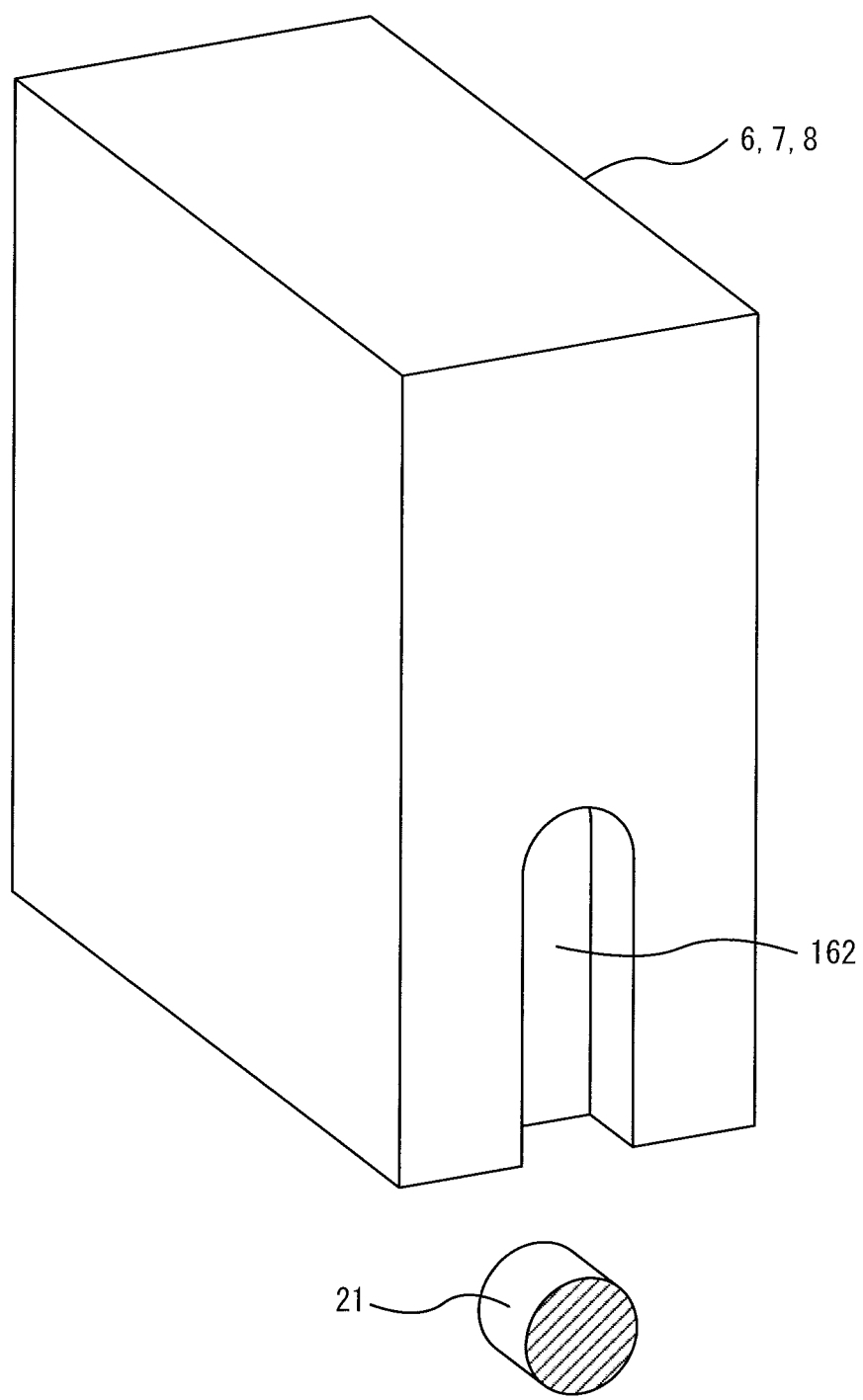
FIG. 24 illustrates an example in which the hole is a depression.

While in the above-described embodiment and modifications the hole 62 and similar holes are through holes, it is possible to use, instead, a depression 162 illustrated in FIG. 24. The depression 162 is engageable with the protrusion 21, and may possibly be used in such applications where the engagement plates are too large in thickness or where no engagement plates are used and it is instead necessary to faun holes directly on the rear side surfaces of the substrate connecting members of the substrate modules 6, 7, and 8. This modification provides advantageous effects similar to the advantageous effects provided in the above-described embodiment.

7-6. Other Modifications

While the above-described embodiment and modifications are applied to motor control apparatuses, the embodiment and modifications may be applied to control apparatuses for controlling machines other than motors. Further, the embodiment and modifications may be applied to any other electronic apparatuses that include, in their housings, a substrate and a substrate module provided with a substrate connecting member to which the substrate is fixed.

As used herein, the terms "perpendicular", "parallel", and "plane" may not necessarily mean "perpendicular", "parallel", and "plane", respectively, in a strict sense. Specifically, the terms "perpendicular", "parallel", and "plane" mean "approximately perpendicular", "approximately parallel", and "approximately plane", respectively, with design-related and production-related tolerance and error taken into consideration.

Also, when the terms "identical", "same", "equivalent", and "different" are used in the context of dimensions, magnitudes, sizes, or positions, these terms may not necessarily mean "identical", "same", "equivalent", and "different", respectively, in a strict sense. Specifically, the terms "identical", "same", "equivalent", and "different" mean "approximately identical", "approximately same", "approximately equivalent", and "approximately different", respectively, with design-related and production-related tolerance and error taken into consideration.

Otherwise, the above-described embodiments and modifications may be combined in any manner deemed suitable.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. An electronic apparatus, comprising:
    a housing comprising:
        a bottom plate; and
        a plurality of side plates connected to the bottom plate, at least one first side plate among the plurality of side plates comprising at least one protrusion protruding toward an inside of the housing;
    a first substrate facing the bottom plate, the first substrate comprises at least one first connector; and
    at least one substrate module standing upright on the first substrate, each of the at least one substrate module comprising:
        a second substrate comprises a second connector, the second connector configured to be connected to a respective one of the first connector of the first substrate; and
        a substrate connecting member to which the second substrate is fixed, the substrate connecting member comprising a hole engaged with a respective one of the at least one protrusion of the at least one first side plate;
    wherein when the respective one of the first connector and the second connector are connected to each other, the hole comprises an abutting portion abutting on a side surface of the respective one of the at least one protrusion; and
    wherein when the abutting portion of the hole abuts the side surface of the respective one of the at least one protrusion, the substrate connecting member is fixed with a first screw to the bottom plate and with a second screw to the at least one first side plate.

2. The electronic apparatus according to claim 1, wherein the hole has a width such that movement of the respective one of the at least one protrusion in a direction perpendicular to the second substrate is restricted, and wherein the hole has a length greater than the width in a direction perpendicular to the first substrate.

3. The electronic apparatus according to claim 2, wherein the substrate module comprises a heat sink fixed to the substrate connecting member and configured to cool an electronic component disposed on the second substrate.

4. The electronic apparatus according to claim 2, wherein the second substrate comprises
    a power substrate facing one surface of the substrate connecting member, and
    a control substrate facing another surface of the substrate connecting member.

5. The electronic apparatus according to claim 1, wherein the substrate module comprises a heat sink provided on the substrate connecting member and configured to cool an electronic component disposed on the second substrate.

6. The electronic apparatus according to claim 5, wherein the second substrate comprises
    a power substrate facing one surface of the substrate connecting member, and
    a control substrate facing another surface of the substrate connecting member.

7. The electronic apparatus according to claim 1, wherein the second substrate comprises a power substrate facing one surface of the substrate connecting member, and a control substrate facing another surface of the substrate connecting member.

8. The electronic apparatus according to claim 1, wherein the at least one substrate module comprises a plurality of substrate modules, and wherein the at least one first side plate has an opening having a length covering the plurality of the substrate modules.

9. The electronic apparatus according to claim 1, wherein the electronic apparatus comprises a motor control apparatus configured to control a motor, and wherein the at least one substrate module comprises:
    a converter module comprising, as the second substrate, a converter substrate configured to convert first AC power supplied from an AC power source into DC power;
    an inverter module comprising, as the second substrate:
        an inverter power substrate configured to convert the DC power into second AC power and supply the second AC power to the motor and an inverter control substrate configured to control power conversion performed by the inverter power substrate; and
    an interface module comprising an interface substrate as the second substrate.

10. The electronic apparatus according to claim 1, wherein the side plates include a third side plate opposite to a second side plate, and wherein the at least one first side plate is provided between the second side plate and the third side plate which are connected to the at least one first side plate.

11. The electronic apparatus according to claim 1, wherein the bottom plate is substantially perpendicular to each of the side plates.

12. The electronic apparatus according to claim 1, wherein the first substrate is substantially parallel to the bottom plate.

13. A method for producing an electronic apparatus, the method comprising:
    placing a first substrate in a housing to face a bottom plate of the housing, the first substrate comprises at least one first connector;
    placing each of at least one substrate module standing upright on the first substrate, the at least one substrate module comprising a second substrate, the second substrate comprises a second connector, the second connector configured to be connected to a respective one of the first connector of the first substrate;
    inserting a respective one of a protrusion of a side plate of the housing into a hole of a substrate connecting member of a respective one of the at least one substrate module, the hole comprises an abutting portion abutting on a side surface of the respective one of the at least one protrusion; moving each of the at least one substrate module in a direction perpendicular to the bottom plate after inserting the respective one of the protrusion into the hole; and
    fixing the substrate connecting member to the bottom plate using a first screw; and
    fixing the substrate connecting member to the side plate with a second screw.

* * * * *